(12) United States Patent
Tseng et al.

(10) Patent No.: US 12,048,258 B2
(45) Date of Patent: Jul. 23, 2024

(54) PHASE CHANGE MEMORY DEVICE AND METHOD FOR MANUFACTURING THE SAME

(71) Applicant: TAIWAN SEMICONDUCTOR MANUFACTURING COMPANY, LTD., Hsinchu (TW)

(72) Inventors: Yuan-Tai Tseng, Hsinchu (TW); Chang-Chih Huang, Hsinchu (TW); Kuo-Chyuan Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 11 days.

(21) Appl. No.: 17/198,868

(22) Filed: Mar. 11, 2021

(65) Prior Publication Data

US 2022/0293854 A1  Sep. 15, 2022

(51) Int. Cl.
*H10N 70/00* (2023.01)

(52) U.S. Cl.
CPC ......... *H10N 70/841* (2023.02); *H10N 70/021* (2023.02); *H10N 70/861* (2023.02)

(58) Field of Classification Search
CPC .................................................... H01L 45/128
See application file for complete search history.

(56) References Cited

U.S. PATENT DOCUMENTS

| | | | | |
|---|---|---|---|---|
| 5,841,802 | A * | 11/1998 | Whiteley | H01S 5/18358 372/98 |
| 2008/0017894 | A1* | 1/2008 | Happ | H10N 70/8828 365/163 |
| 2010/0044669 | A1* | 2/2010 | Happ | H10N 70/231 257/3 |
| 2015/0099317 | A1* | 4/2015 | Hayakawa | H04B 10/503 398/201 |
| 2020/0091242 | A1* | 3/2020 | Cheng | H10N 70/023 |
| 2021/0151506 | A1* | 5/2021 | Kim | H10B 63/84 |
| 2022/0020817 | A1* | 1/2022 | Yang | H10N 70/063 |

* cited by examiner

*Primary Examiner* — Moazzam Hossain
*Assistant Examiner* — Hajar Kolahdouzan
(74) *Attorney, Agent, or Firm* — Birch, Stewart, Kolasch & Birch, LLP

(57) ABSTRACT

A phase change memory device includes a first electrode, a second electrode, a phase change region, a first spacer and a second spacer. The second electrode is disposed over the first electrode. The phase change region is disposed between the first and second electrodes. The first spacer laterally covers the phase change region. The second spacer laterally covers the first spacer, and has a thermal conductivity smaller than that of the first spacer.

20 Claims, 40 Drawing Sheets

PHASE CHANGE MEMORY DEVICE AND METHOD FOR MANUFACTURING THE SAME

BACKGROUND

A phase change memory device is a type of non-volatile memory device, and each memory cell thereof can be switched among at least two different states (including an amorphous state and a crystalline state) to store data. When the phase change memory device has a very small pitch, it is easy for one memory cell thereof to thermally disturb another memory cell thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9 to 26, 28 to 32, and 34 to 38 are schematic sectional views and FIGS. 27 and 33 are schematic perspective views.

DETAILED DESCRIPTION

Figure 1:
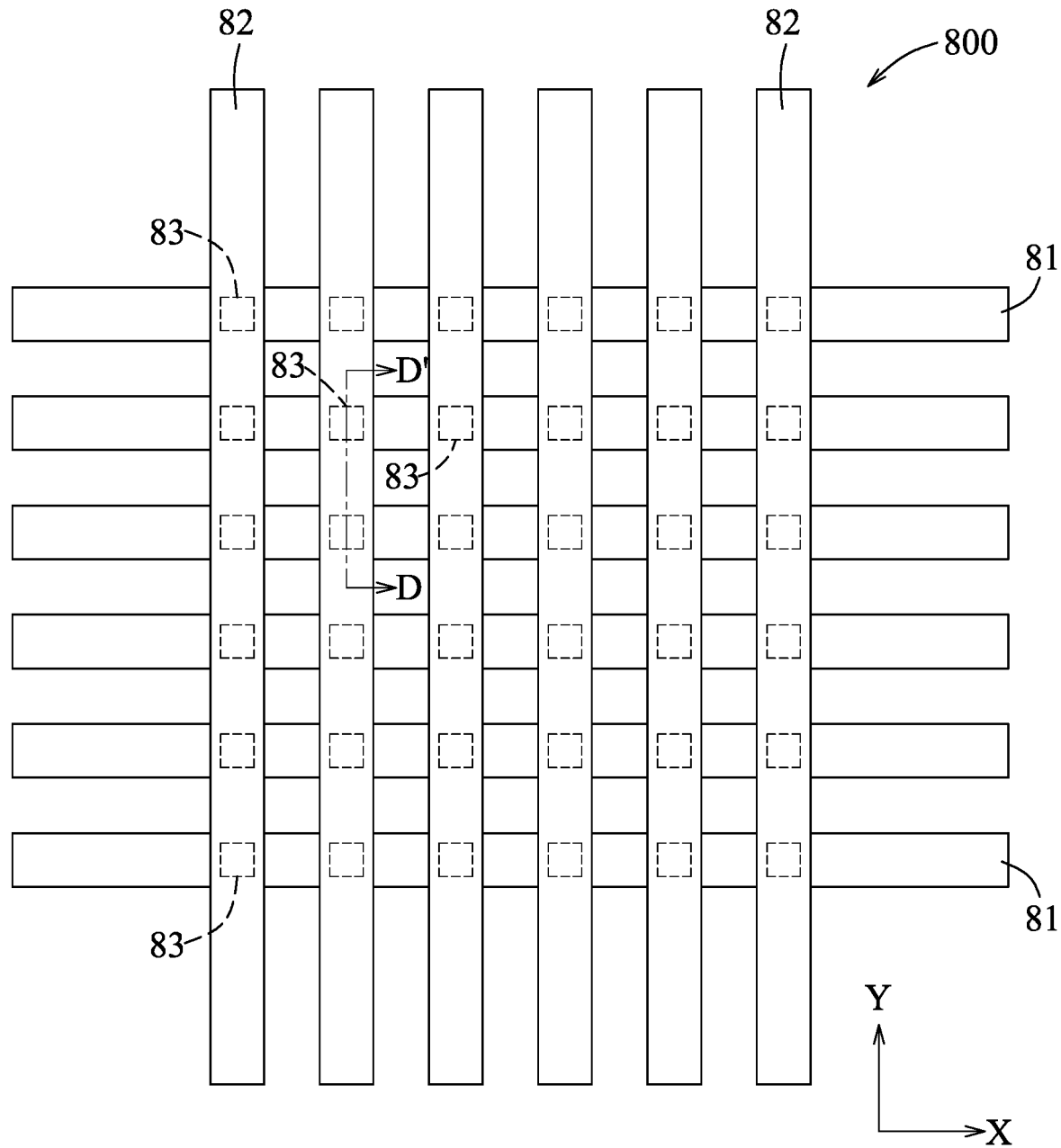
FIG. 1 is a schematic top view of a phase change memory device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

Figure 2:
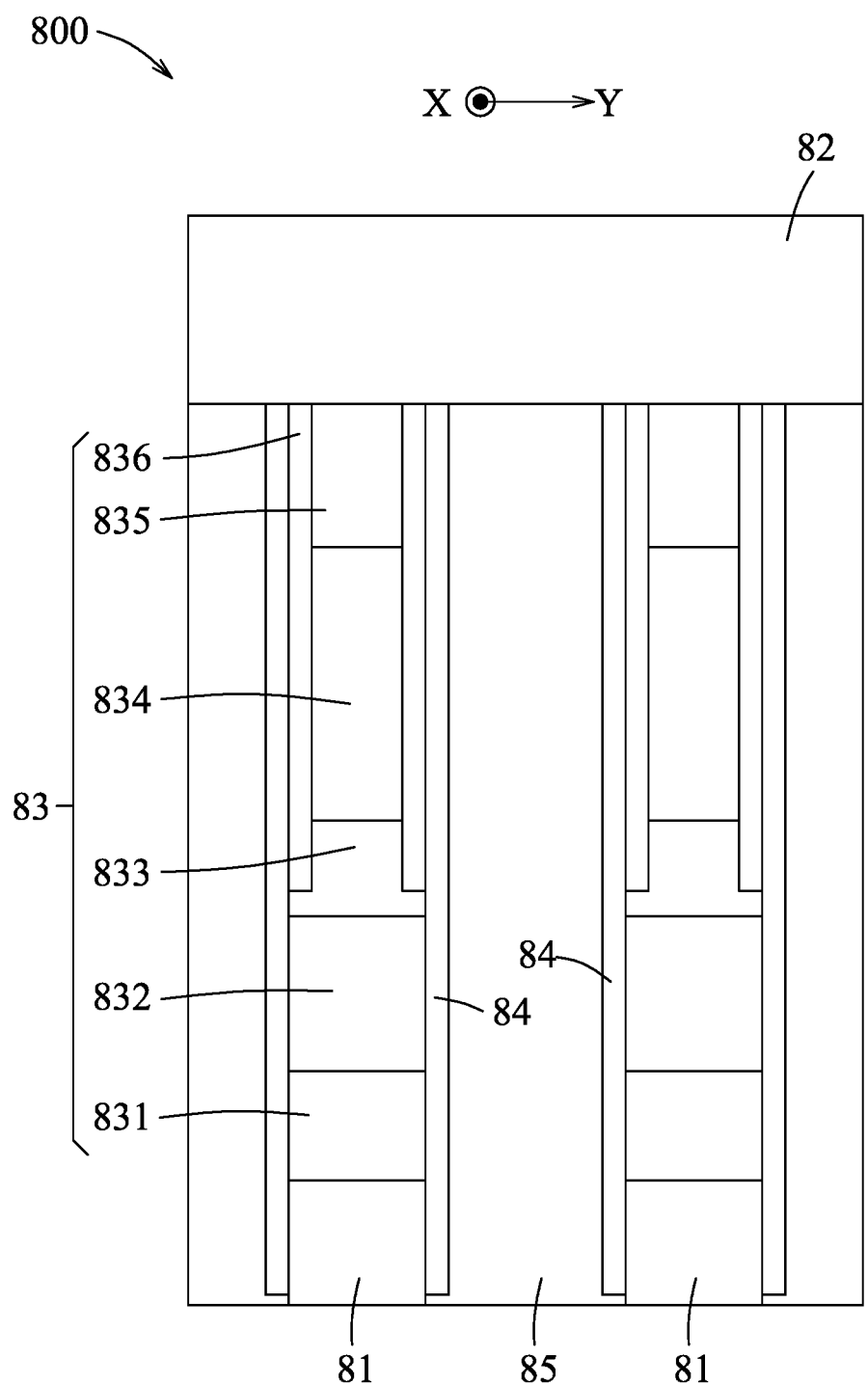
FIG. 2 is a schematic sectional view of the phase change memory device taken along line D-D' in a Y direction of FIG. 1 in accordance with some embodiments.

FIG. 1 is a schematic top view of a phase change memory device 800 in accordance with some embodiments. FIG. 2 is a schematic sectional view of the phase change memory device 800 taken along line D-D' in a Y direction of FIG. 1 in accordance with some embodiments. The phase change memory device 800 includes a plurality of first conductive lines 81 (for example but not limited to word lines), a plurality of second conductive lines 82 (for example but not limited to bit lines), a plurality of memory cells 83, a plurality of outside spacers 84 and an insulator 85. The outside spacers 84 and the insulator 85 are not depicted in FIG. 1. The first conductive lines 81 extend in an X direction. The second conductive lines 82 extend in the Y direction, and are disposed over the first conductive lines 81. Each of the memory cells 83 is disposed between a corresponding one of the first conductive lines 81 and a corresponding one of the second conductive lines 82. The outside spacers 84 respectively surround the memory cells 83. The insulator 85 surrounds the outside spacers 84.

Each of the memory cells 83 includes a bottom electrode 831, a selector 832, a middle electrode 833, a phase change region 834, a top electrode 835 and a first spacer 836. The bottom electrode 831, the selector 832, the middle electrode 833, the phase change region 834 and the top electrode 835 are stacked from bottom to top between the corresponding first conductive line 81 and the corresponding second conductive line 82. The bottom electrode 831, the selector 832 and a lower portion of the middle electrode 833 have the same width. An upper portion of the middle electrode 833, the phase change region 834 and the top electrode 835 have the same width. The width of the phase change region 834 is smaller than that of the selector 832. The first spacer 836 laterally covers the upper portion of the middle electrode 833, the phase change region 834 and the top electrode 835 to surround the same.

Figure 3:
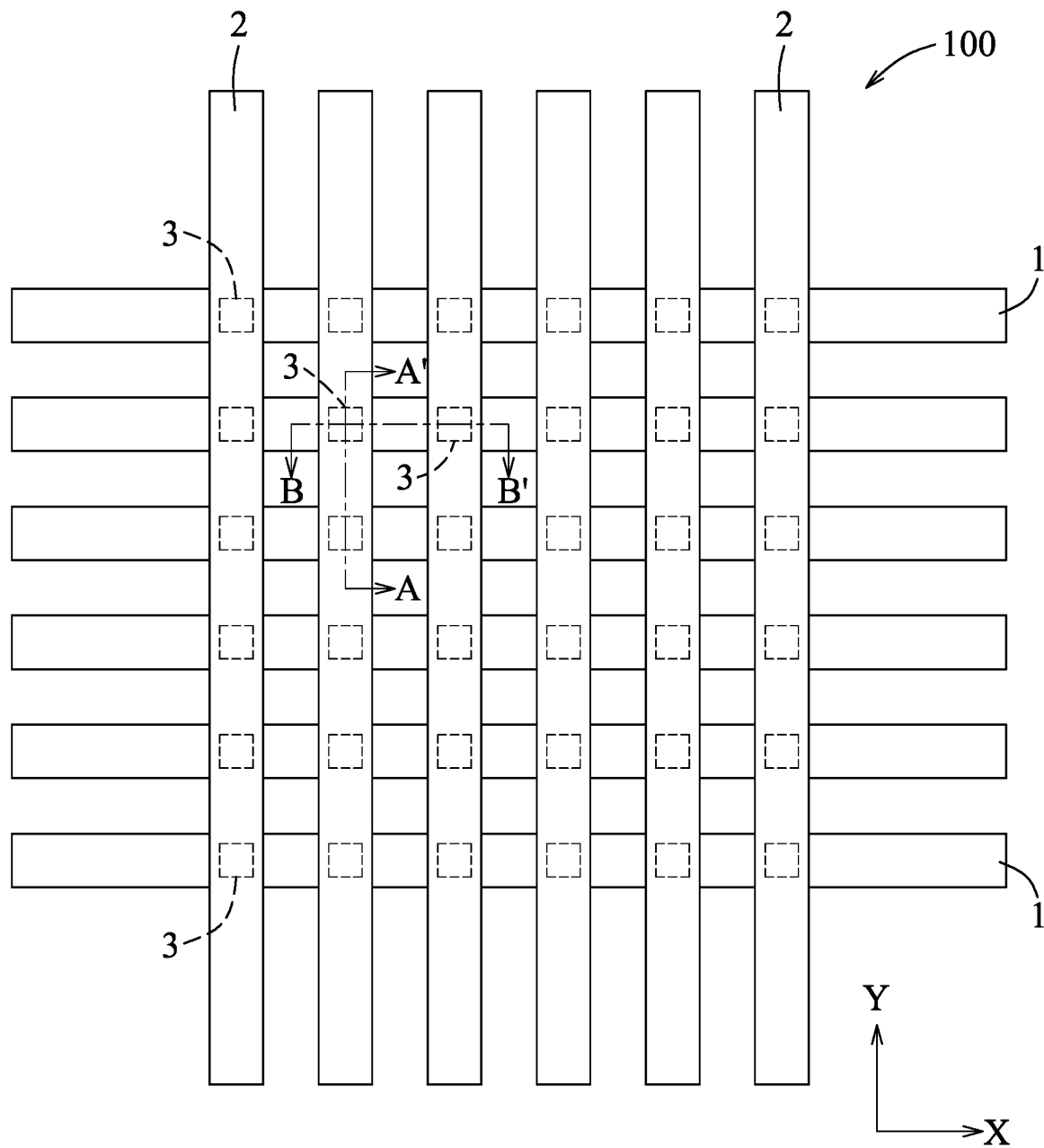
FIG. 3 is a schematic top view of a phase change memory device in accordance with some embodiments.
Figure 4:
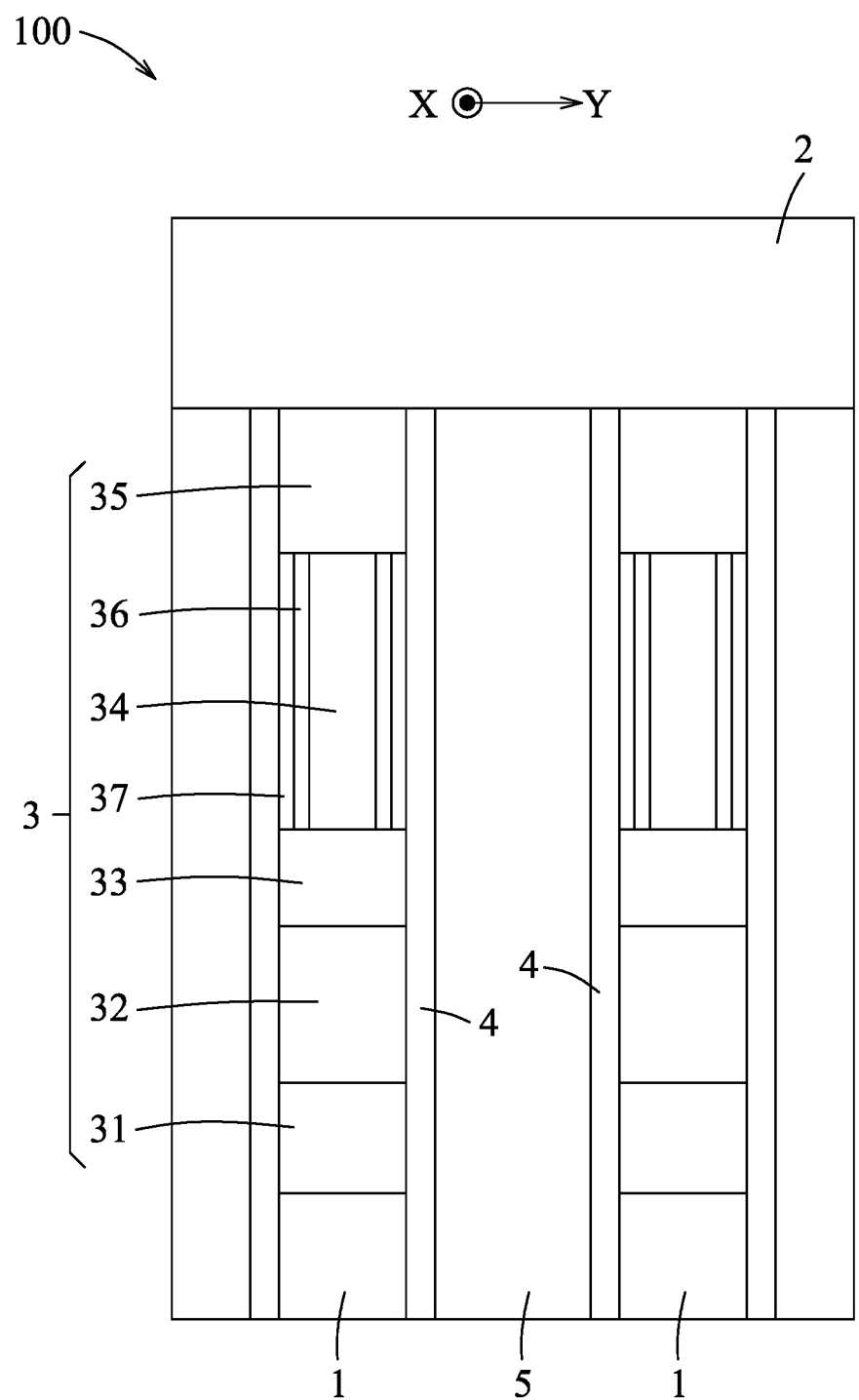
FIGS. 4 and 5 are schematic sectional views of the phase change memory device respectively taken along line A-A' in a Y direction and line B-B' in an X direction of FIG. 3 in accordance with some embodiments.
Figure 5:
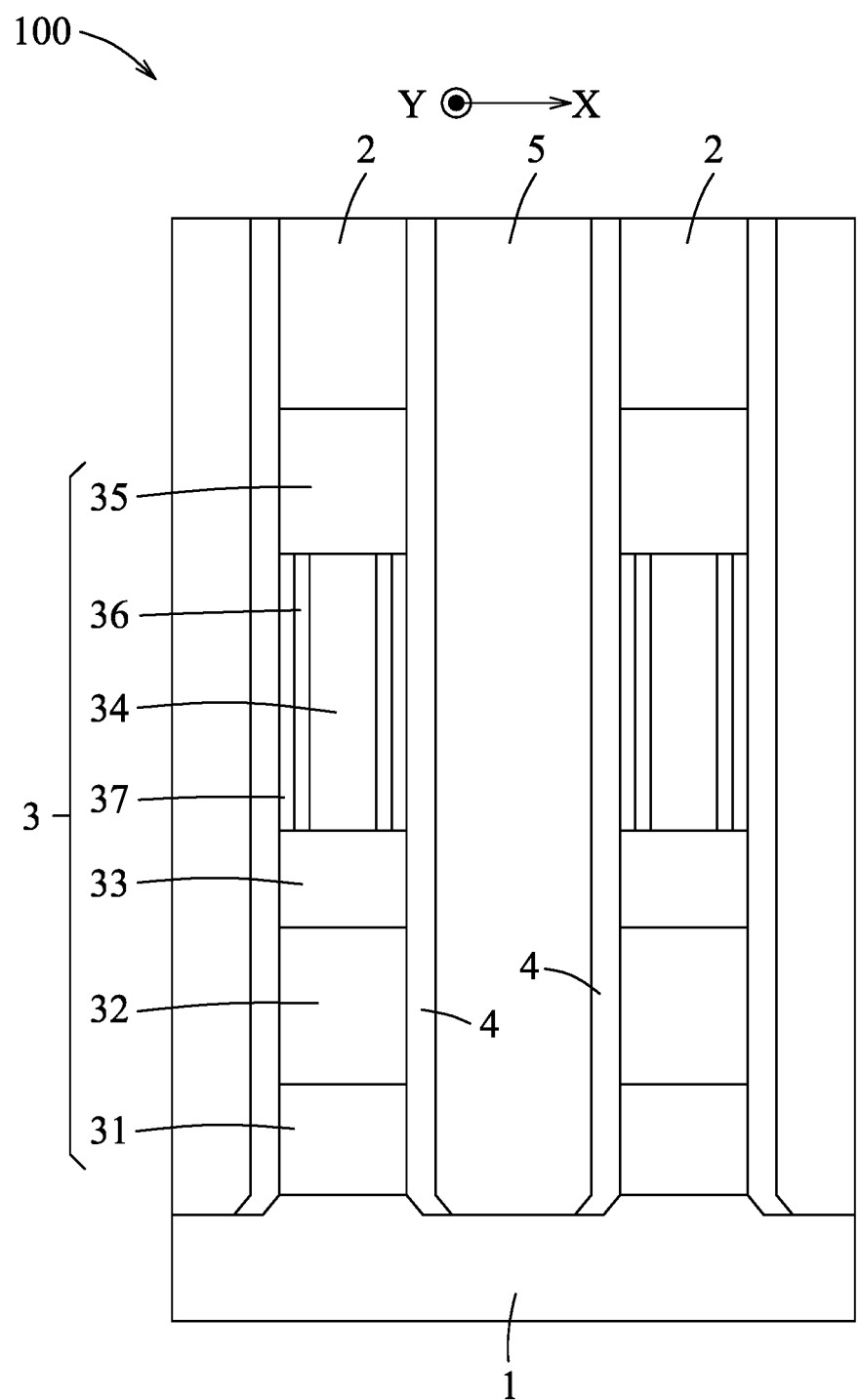

FIG. 3 is a schematic top view of a phase change memory device 100 in accordance with some embodiments. FIGS. 4 and 5 are schematic sectional views of the phase change memory device 100 respectively taken along line A-A' in a Y direction and line B-B' in an X direction of FIG. 3 in accordance with some embodiments. The X and Y directions are different from each other (for example but not limited to being transverse to each other). The phase change memory device 100 includes a plurality of first conductive lines 1 (for example but not limited to word lines), a plurality of second conductive lines 2 (for example but not limited to bit lines), a plurality of memory cells 3, a plurality of outside spacers 4 and an insulator 5. The outside spacers 4 and the insulator 5 are not depicted in FIG. 3. The first conductive lines 1 extend in the X direction. The second conductive lines 2 extend in the Y direction, and are disposed over the first conductive lines 1. Each of the memory cells 3 is disposed between a corresponding one of the first conductive lines 1 and a corresponding one of the second conductive lines 2.

The outside spacers 4 respectively surround the memory cells 3. The insulator 5 surrounds the outside spacers 4.

Figure 6:
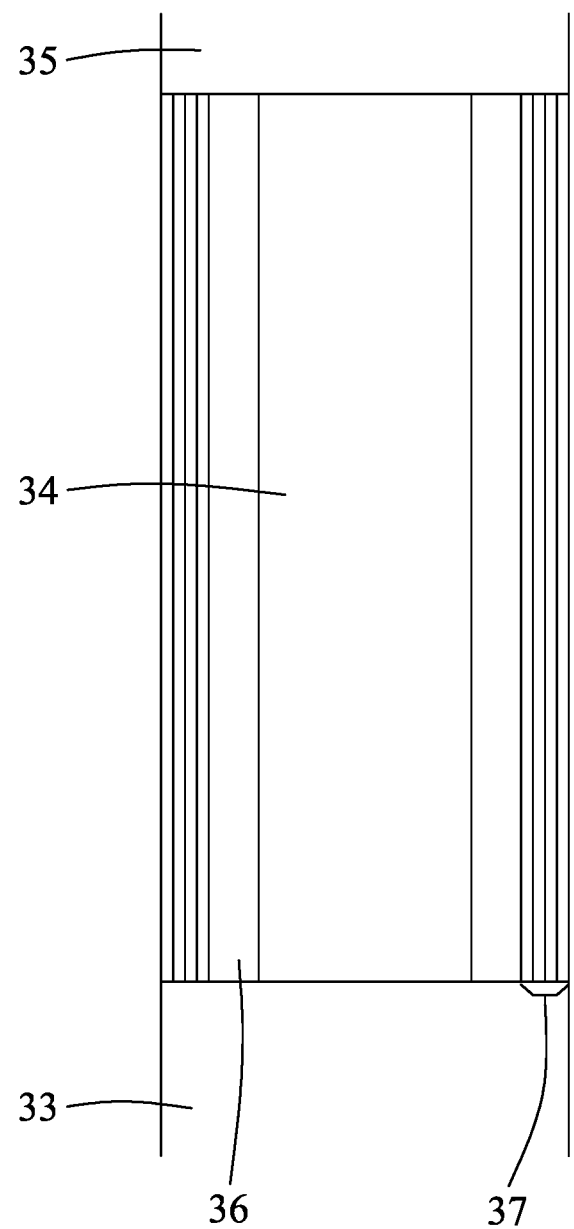
FIG. 6 is a schematic sectional view of a memory cell of a phase change memory device in accordance with some embodiments.

Each of the memory cells 3 includes a bottom electrode 31, a selector 32, a middle electrode 33, a phase change region 34, a top electrode 35, a first spacer 36 and a second spacer 37. The bottom electrode 31, the selector 32, the middle electrode 33, the phase change region 34 and the top electrode 35 are stacked from bottom to top between the corresponding first conductive line 1 and the corresponding second conductive line 2. The bottom electrode 31, the selector 32, the middle electrode 33 and the top electrode 35 have the same width. The selector 32 is, for example but not limited to, an ovonic threshold switch (OTS), which is a two-terminal symmetrical voltage sensitive switching device, and which can be switched between a high resistive state and a low resistive state by a voltage supplied thereto. The phase change region 34 has a width smaller than that of each of the bottom electrode 31, the selector 32, the middle electrode 33 and the top electrode 35. The first spacer 36 laterally covers and surrounds the phase change region 34, and protects the phase change region 34 from being damaged. The second spacer 37 laterally covers and surrounds the first spacer 36, and has a thermal conductivity smaller than that of the first spacer 36, so as to confine heat generated by the phase change region 34. The first and second spacers 36, 37 extend between the middle electrode 33 and the top electrode 35, and contact with a top surface of the middle electrode 33 and a bottom surface of the top electrode 35. In some embodiments, the second spacer 37 includes a single layer as shown in FIGS. 4 and 5. In some other embodiments, the second spacer 37 includes multiple layers that are arranged from inside to outside as shown in FIG. 6. Each of the layers has a predetermined thickness and any two adjacent ones of the layers have different lattice arrangements such that lattice dislocation is formed, and as a consequence, the thermal conductivity of the second spacer 37 as a whole is smaller than that of each of the layers taken individually. The more layers the second spacer 37 includes, the lower the thermal conductivity of the second spacer 37 gets. In some other embodiments, the layers include at least one first layer, and at least one second layer that is different from the at least one first layer in terms of lattice arrangement and that is arranged alternatingly with the at least one first layer. The selector 32 is protected by the corresponding outside spacer 4 from being damaged.

In some embodiments, the outside spacers 4 have a low thermal conductivity to assist in confining the heat generated by the phase change regions 34 of the memory cells 3. In some embodiment, the insulator 5 has a low thermal conductivity to assist in confining the heat generated by the phase change regions 34 of the memory cells 3.

Figure 7:
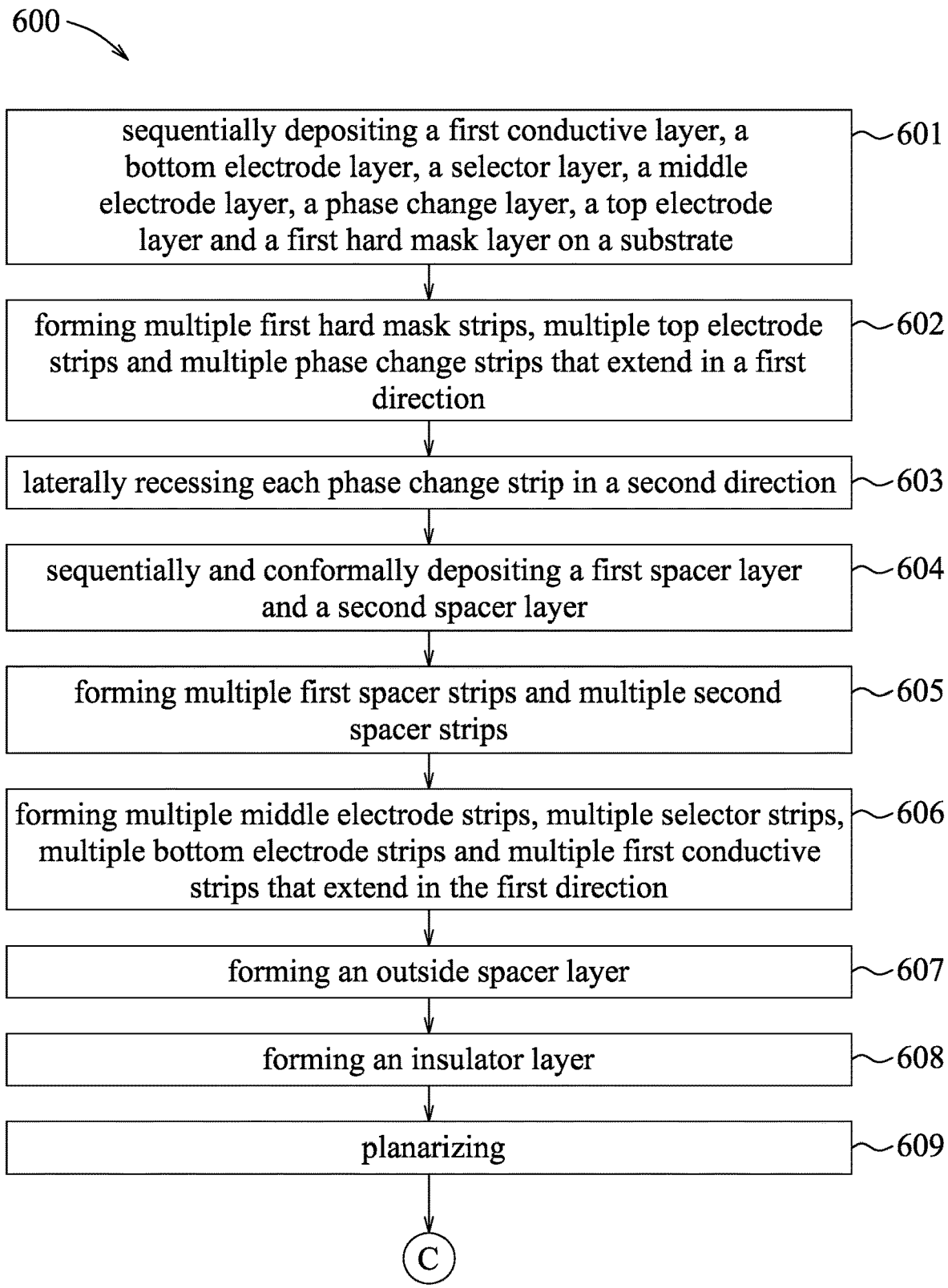
FIGS. 7 and 8 are flow charts illustrating a method for manufacturing a phase change memory device in accordance with some embodiments.
Figure 8:
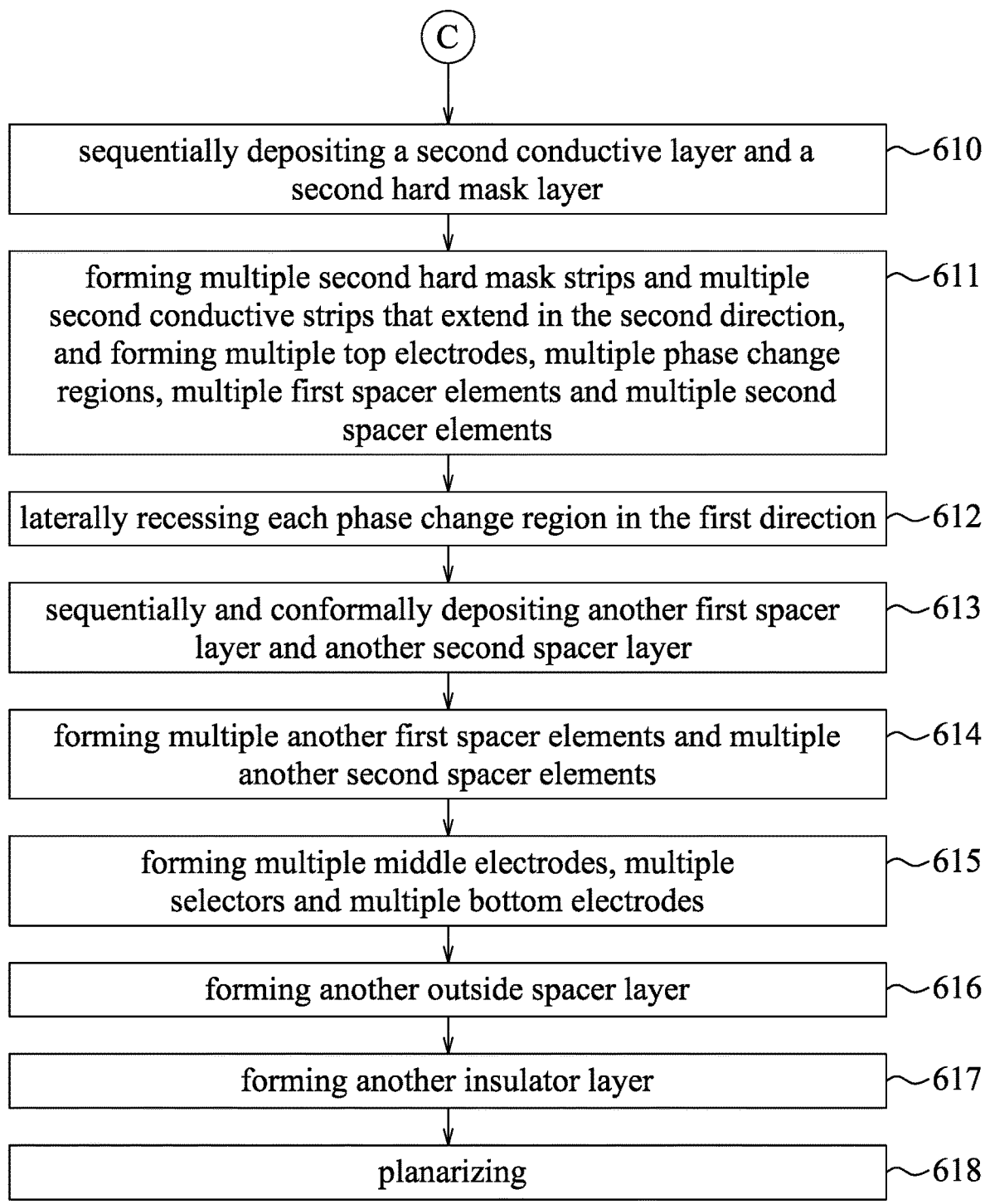
Figure 9:
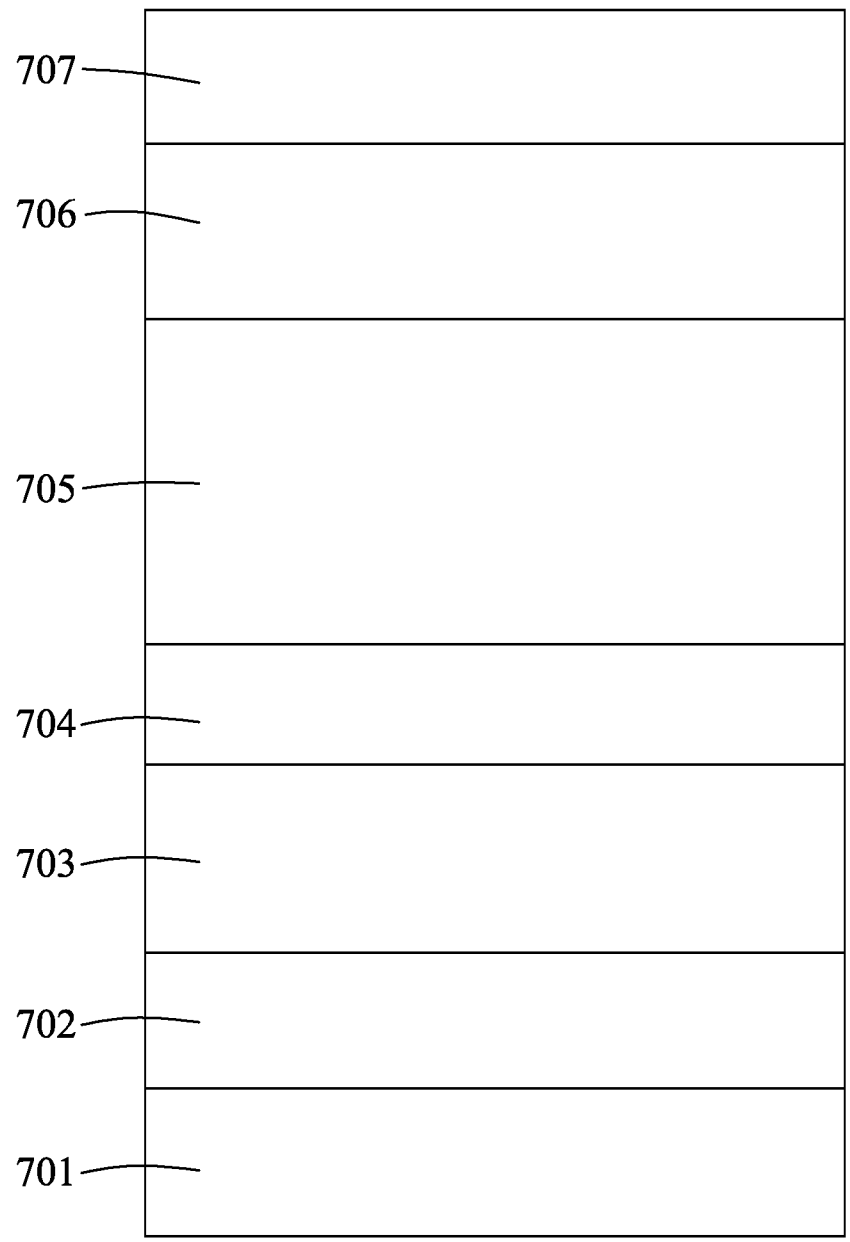
FIGS. 9 to 38 illustrate intermediate stages of the method for manufacturing a phase change memory device as depicted in FIGS. 7 and 8, where
Figure 10:
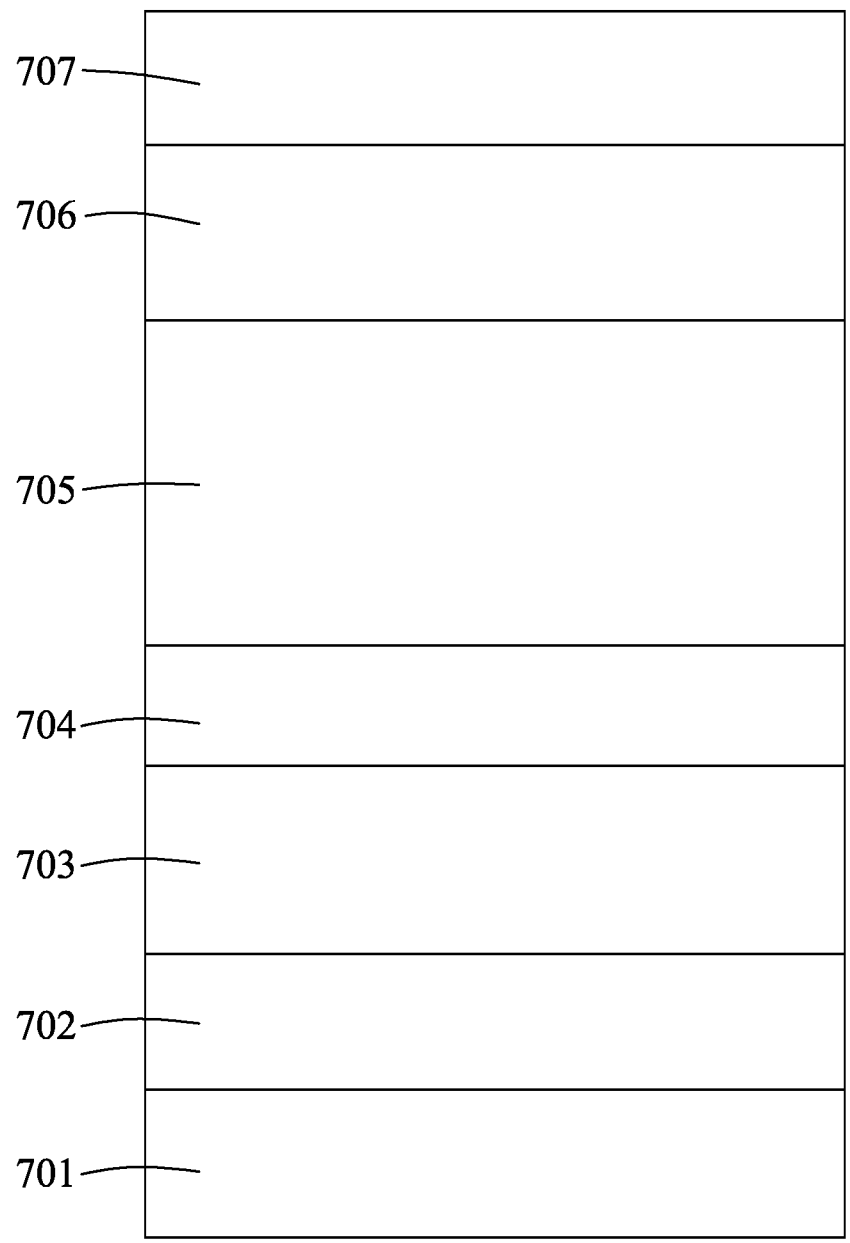
Figure 11:
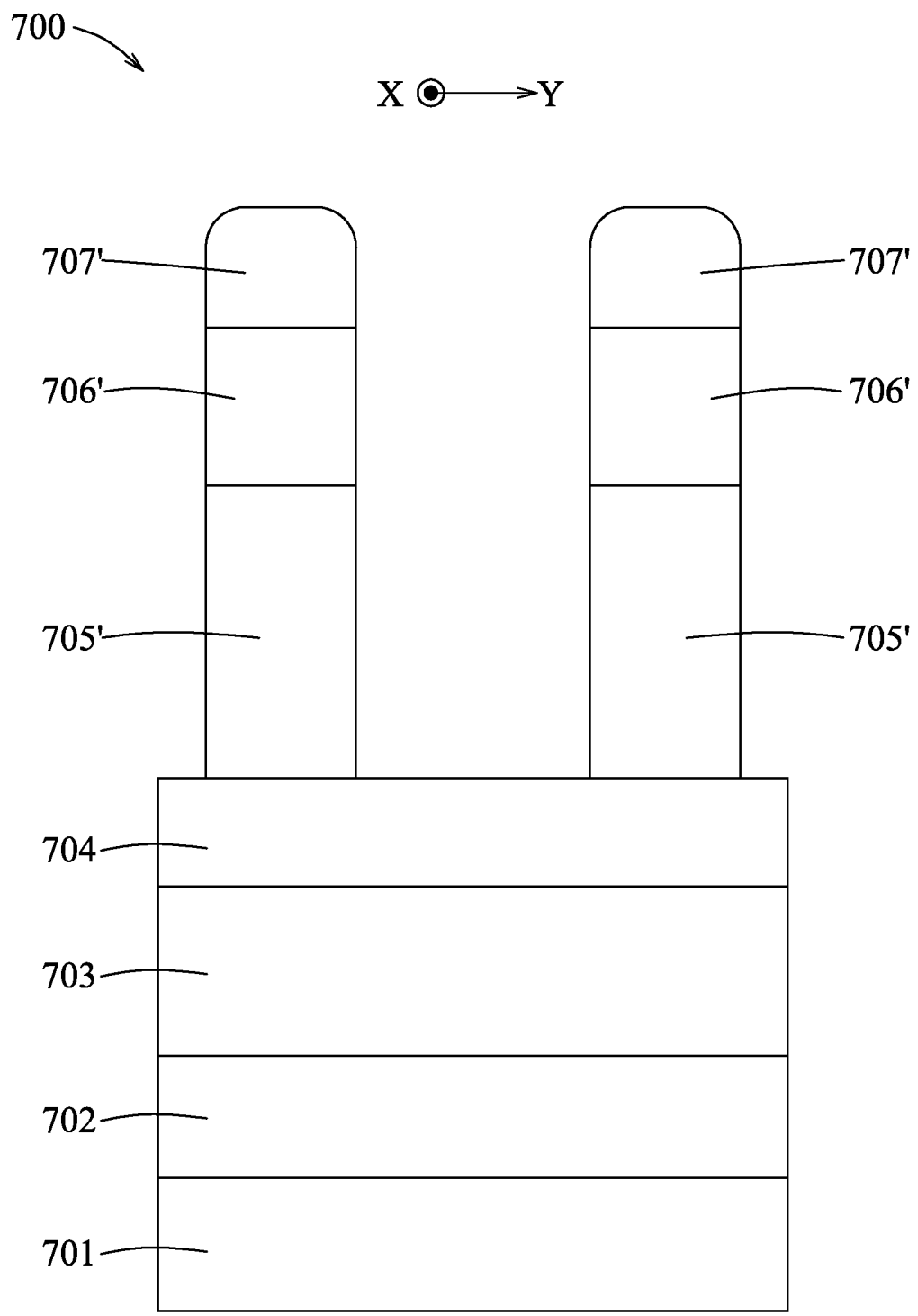
Figure 12:
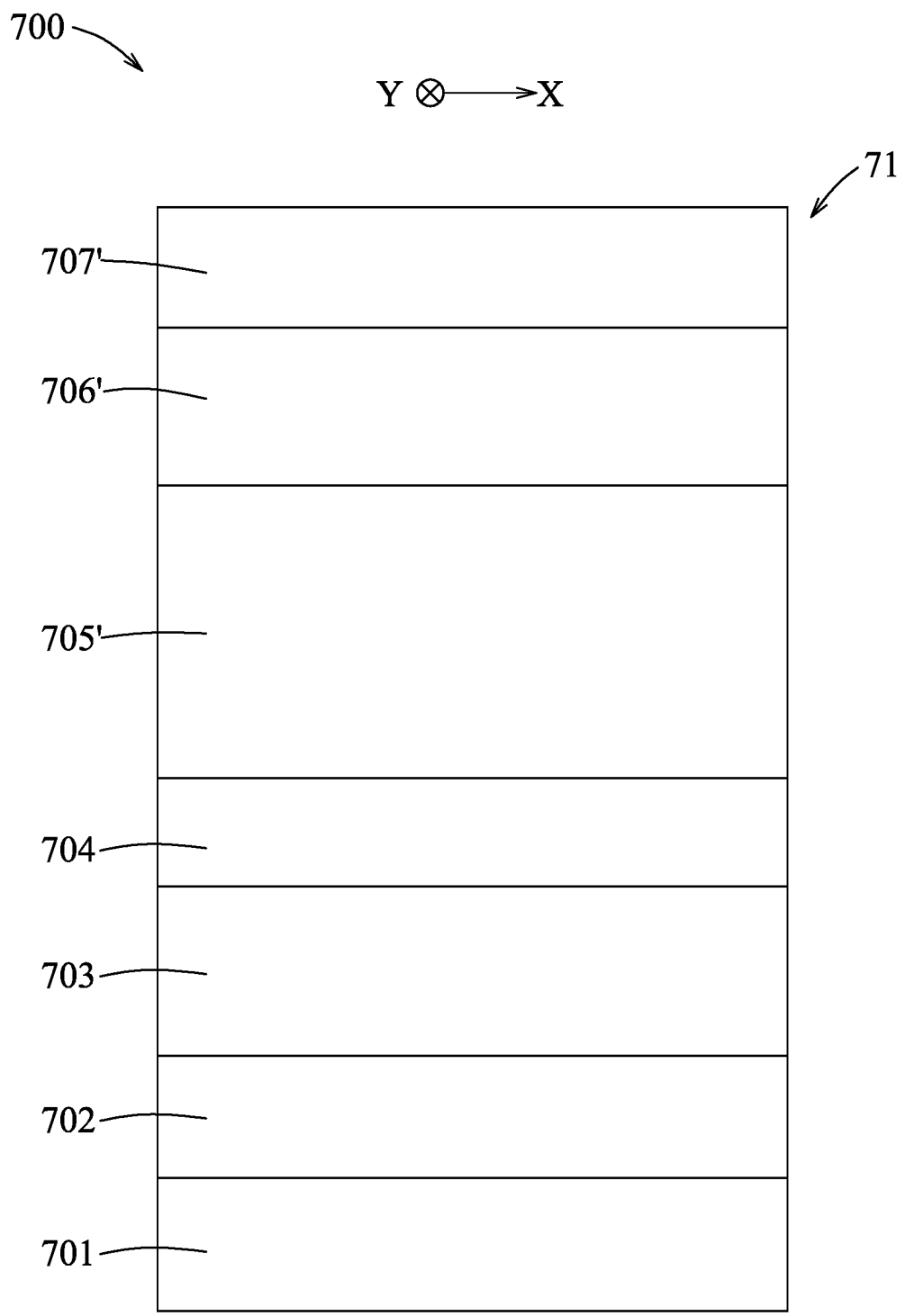
Figure 13:
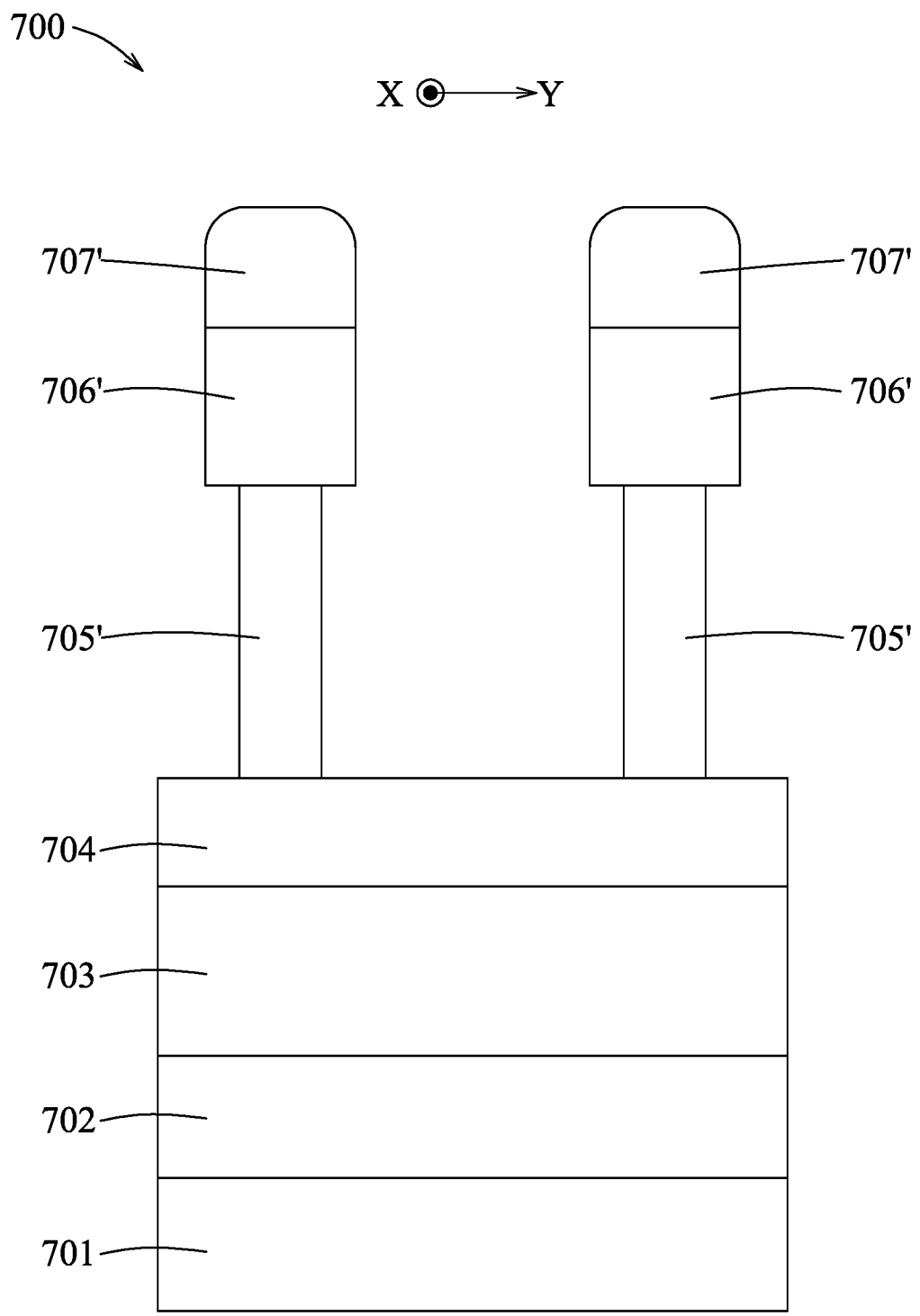
Figure 14:
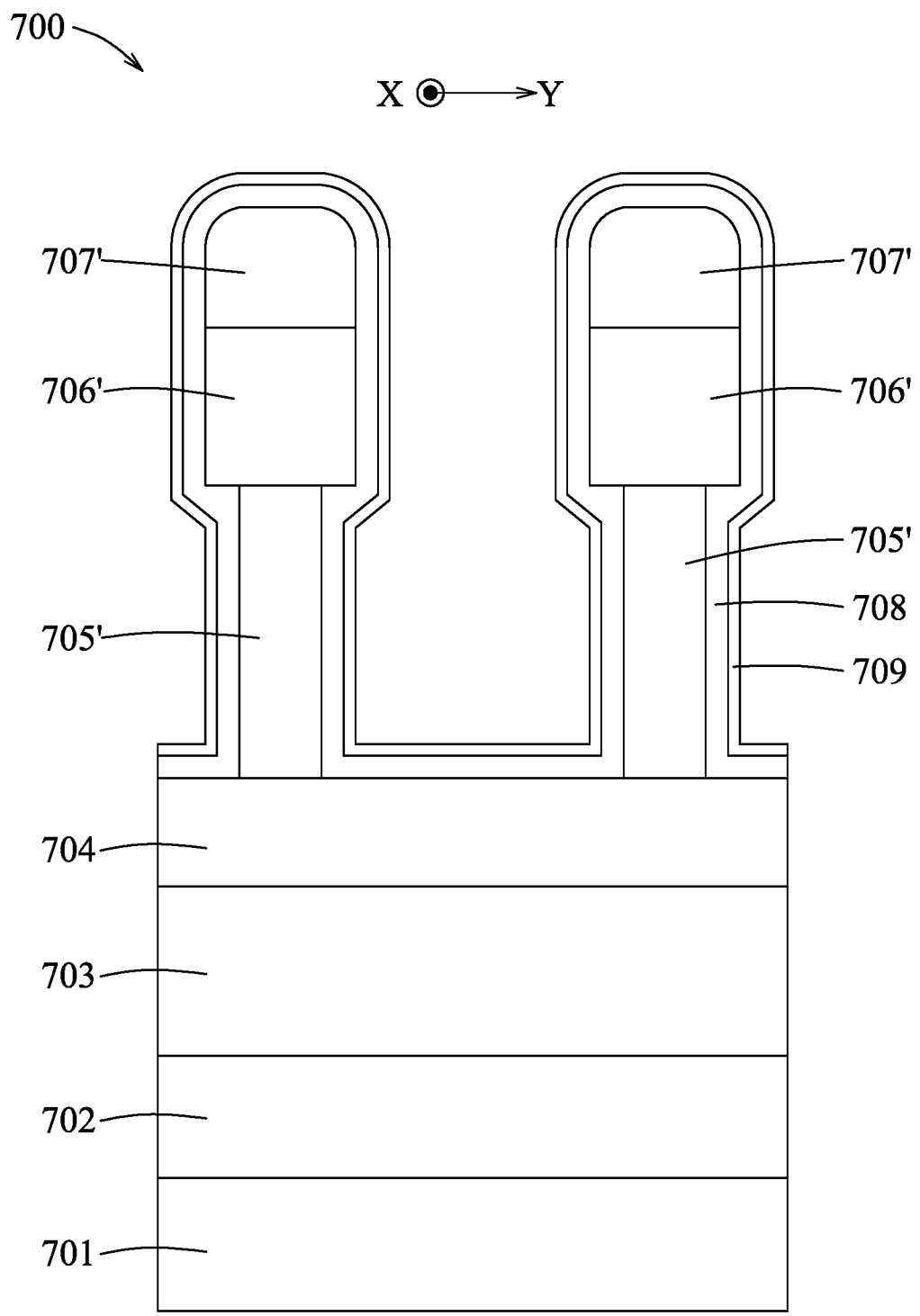
Figure 15:
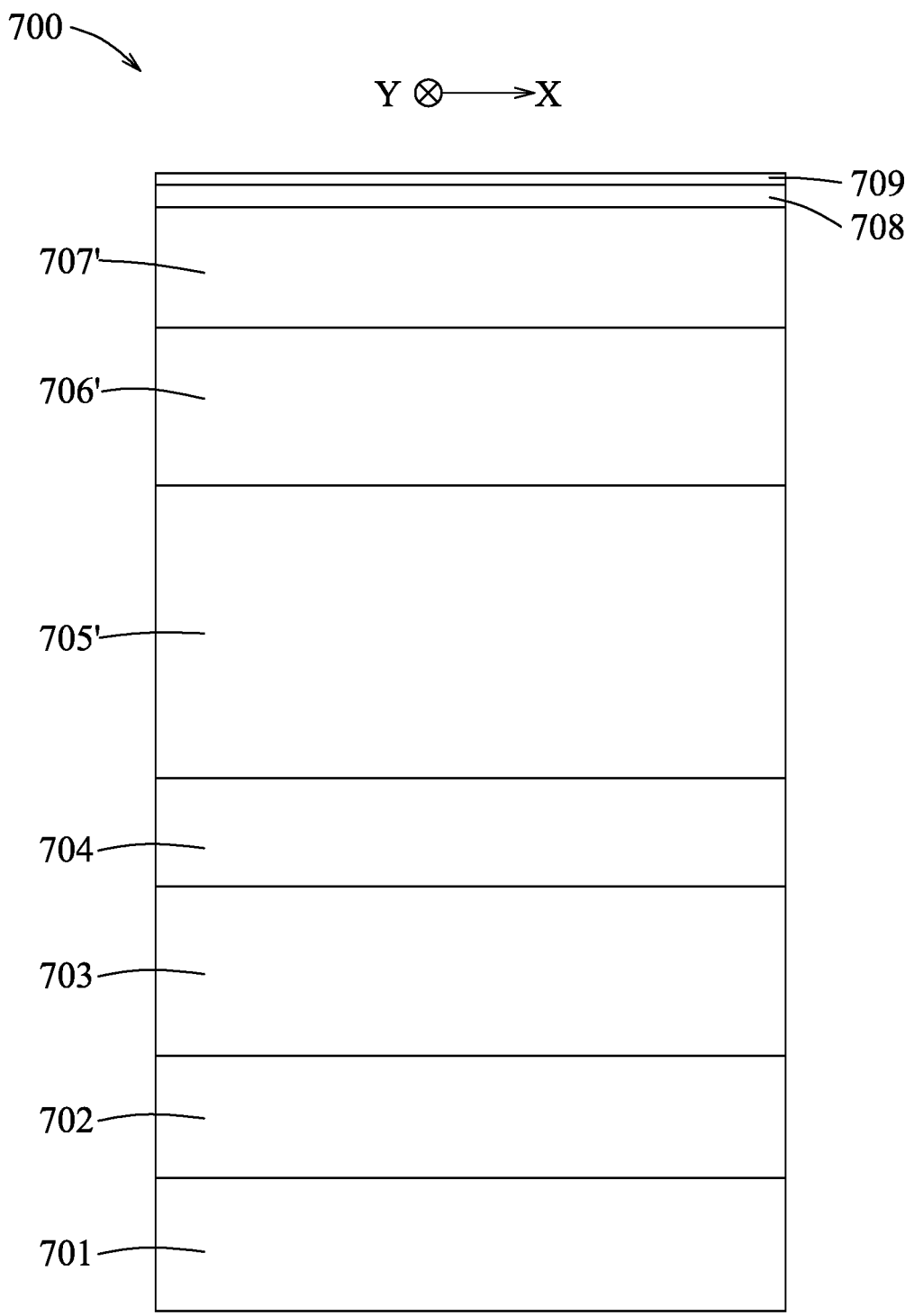
Figure 16:
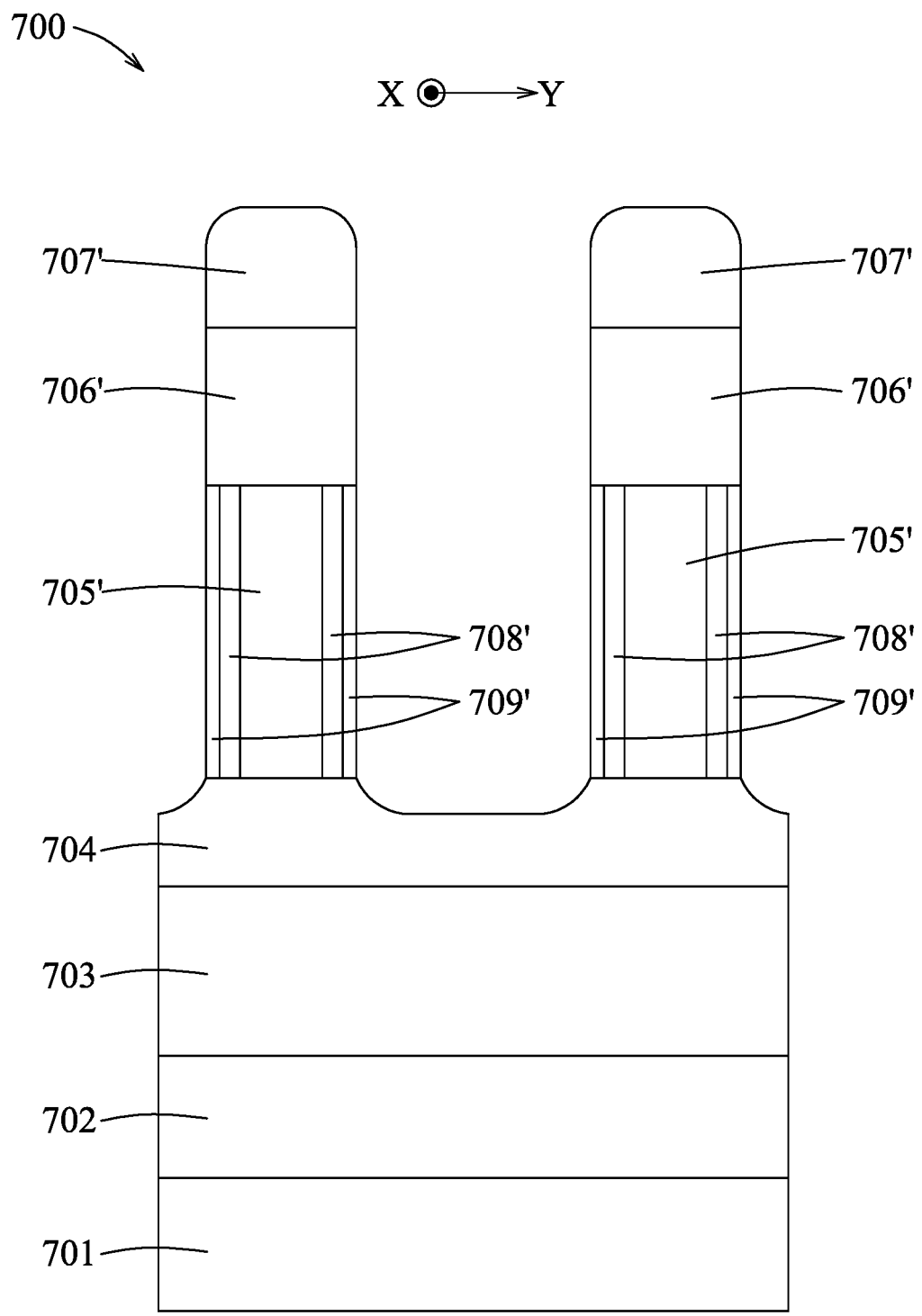
Figure 17:
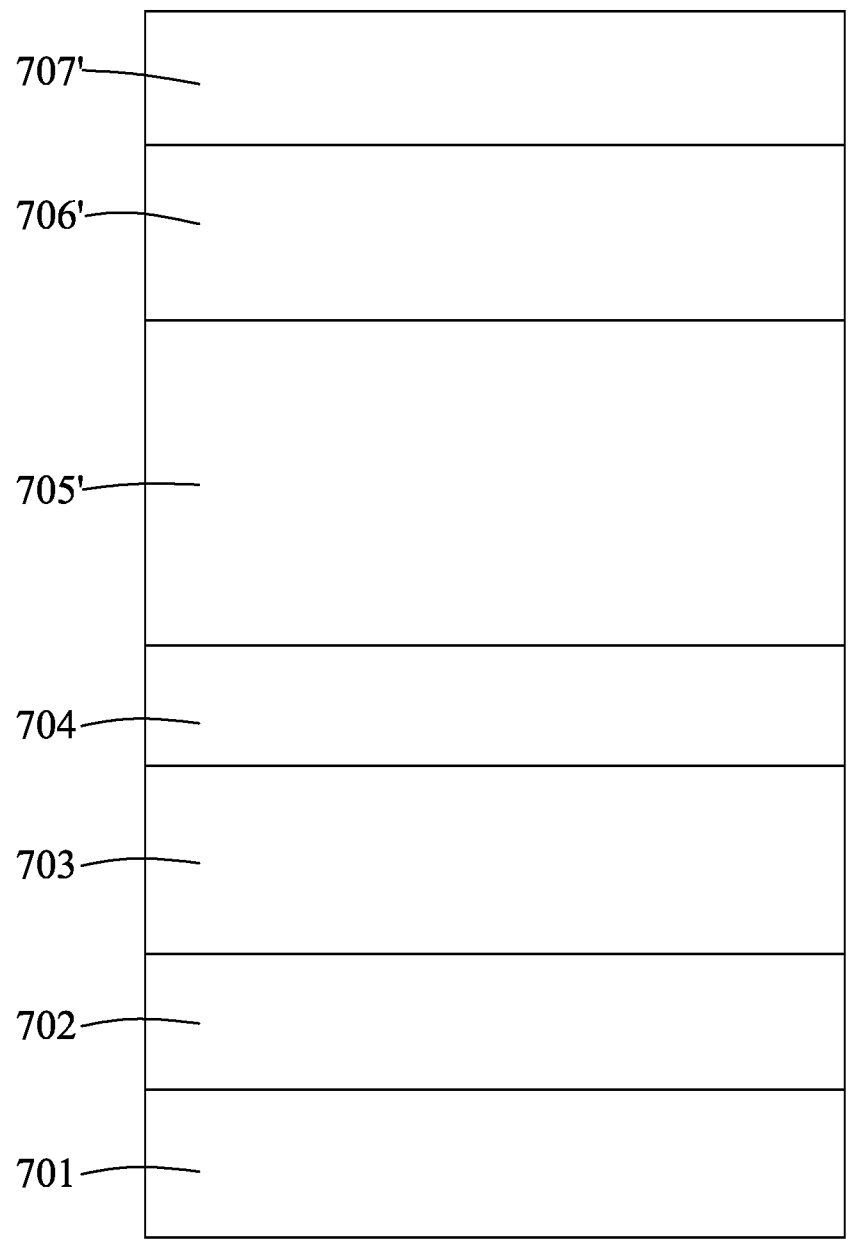
Figure 18:
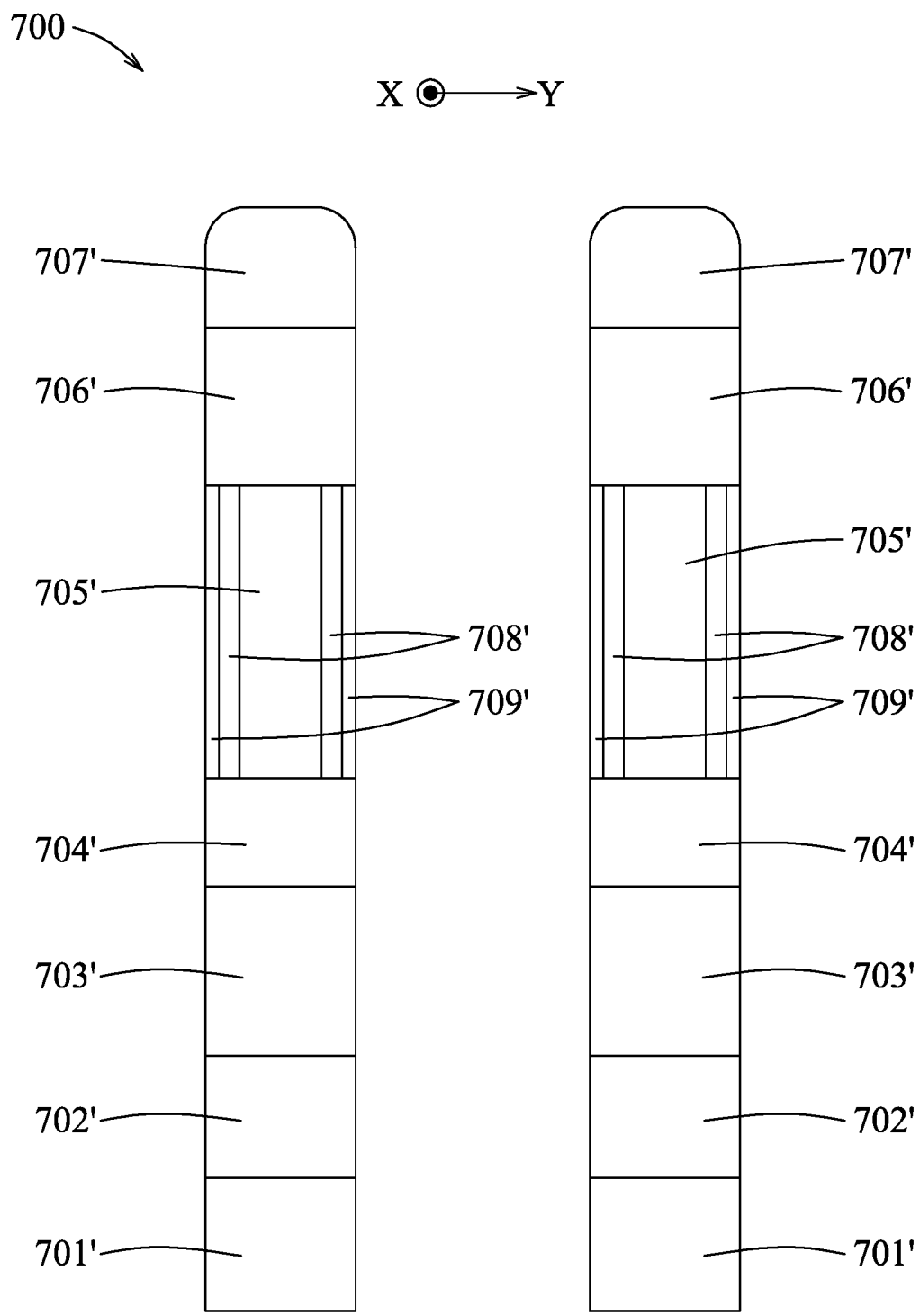
Figure 19:
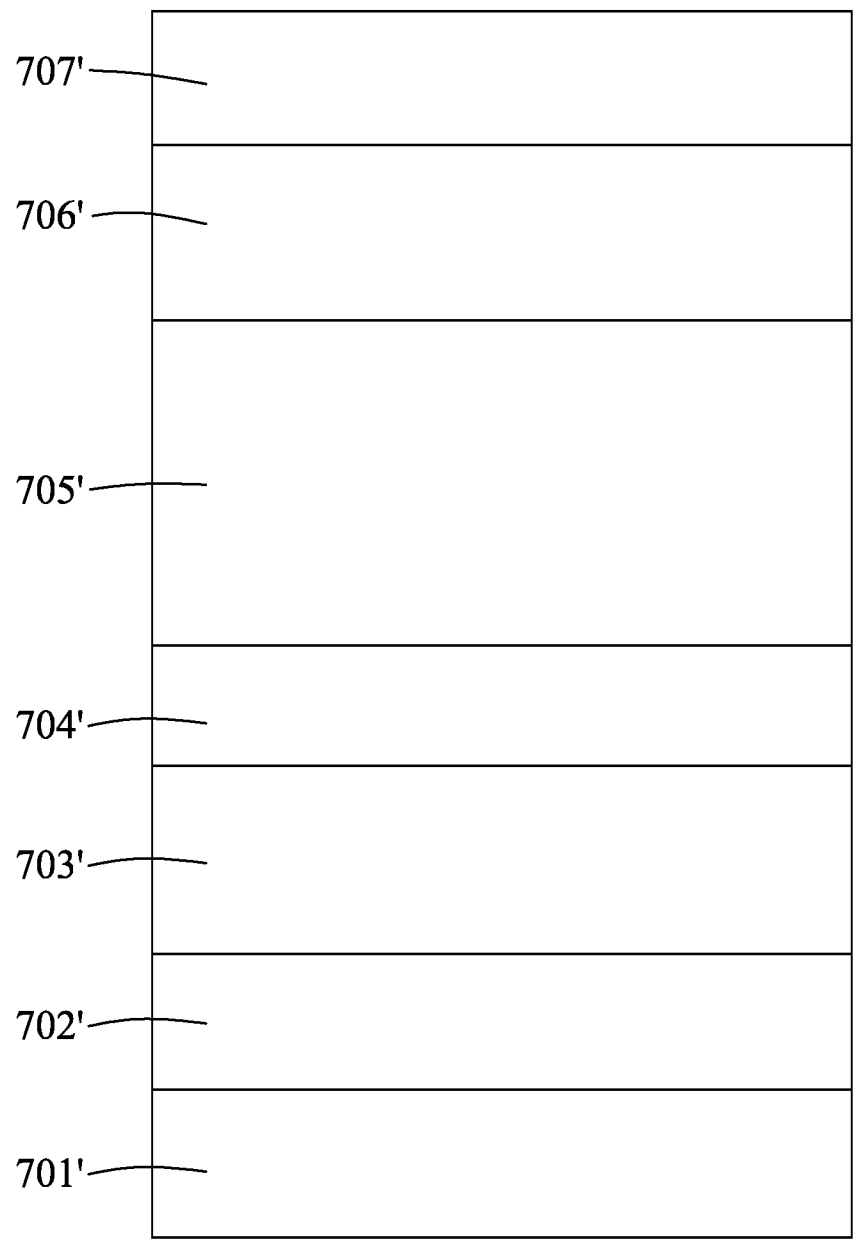
Figure 20:
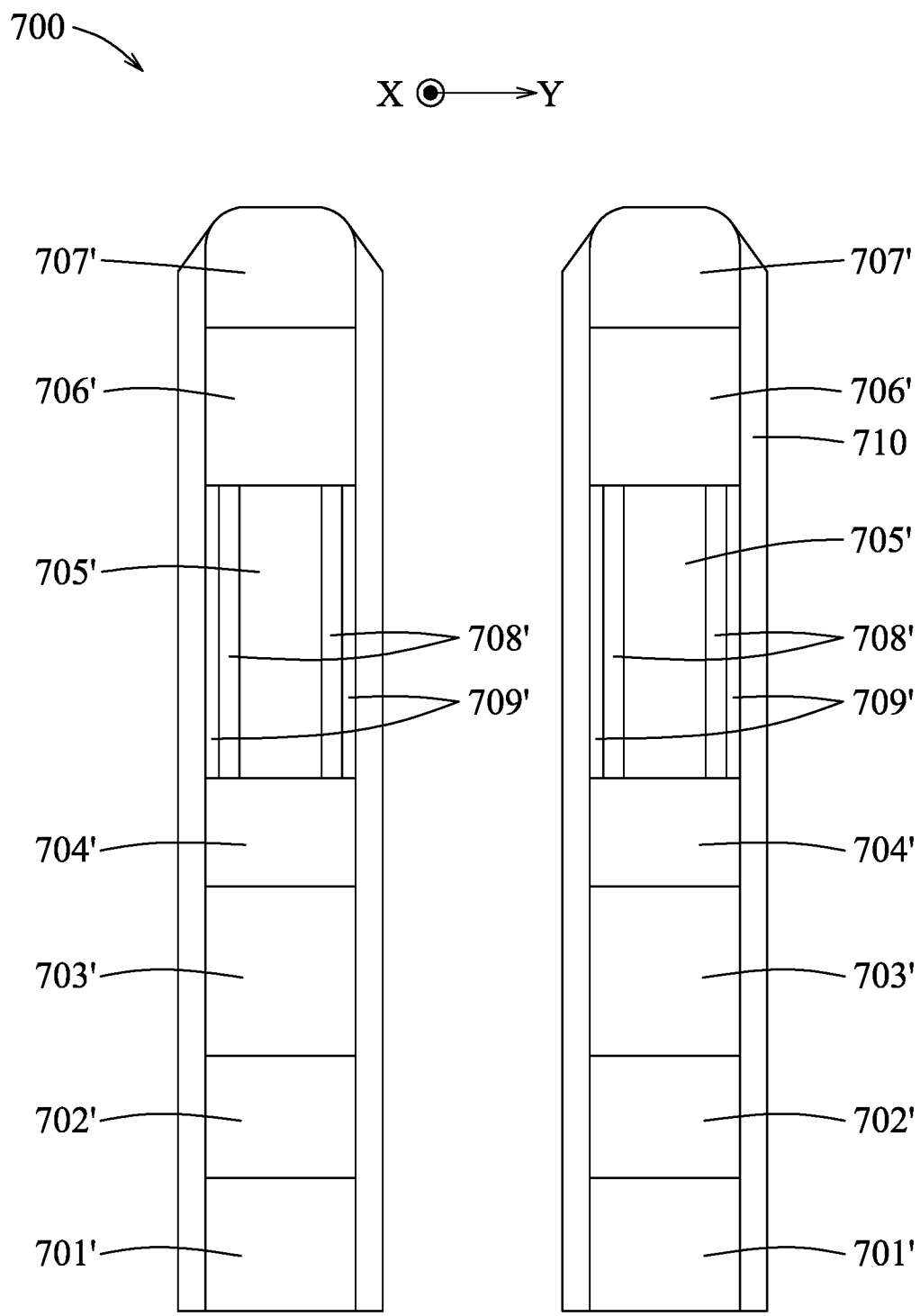
Figure 21:
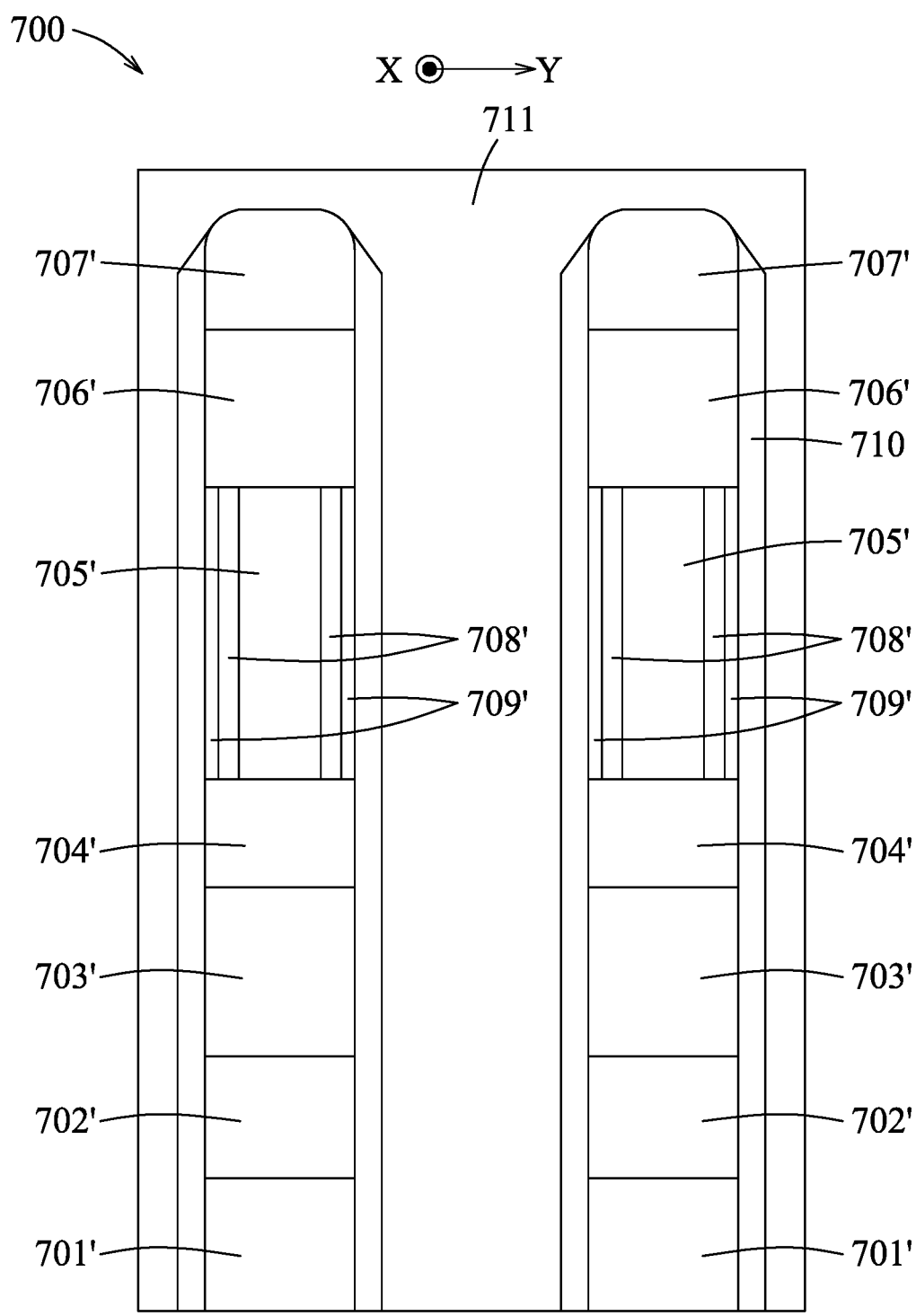
Figure 22:
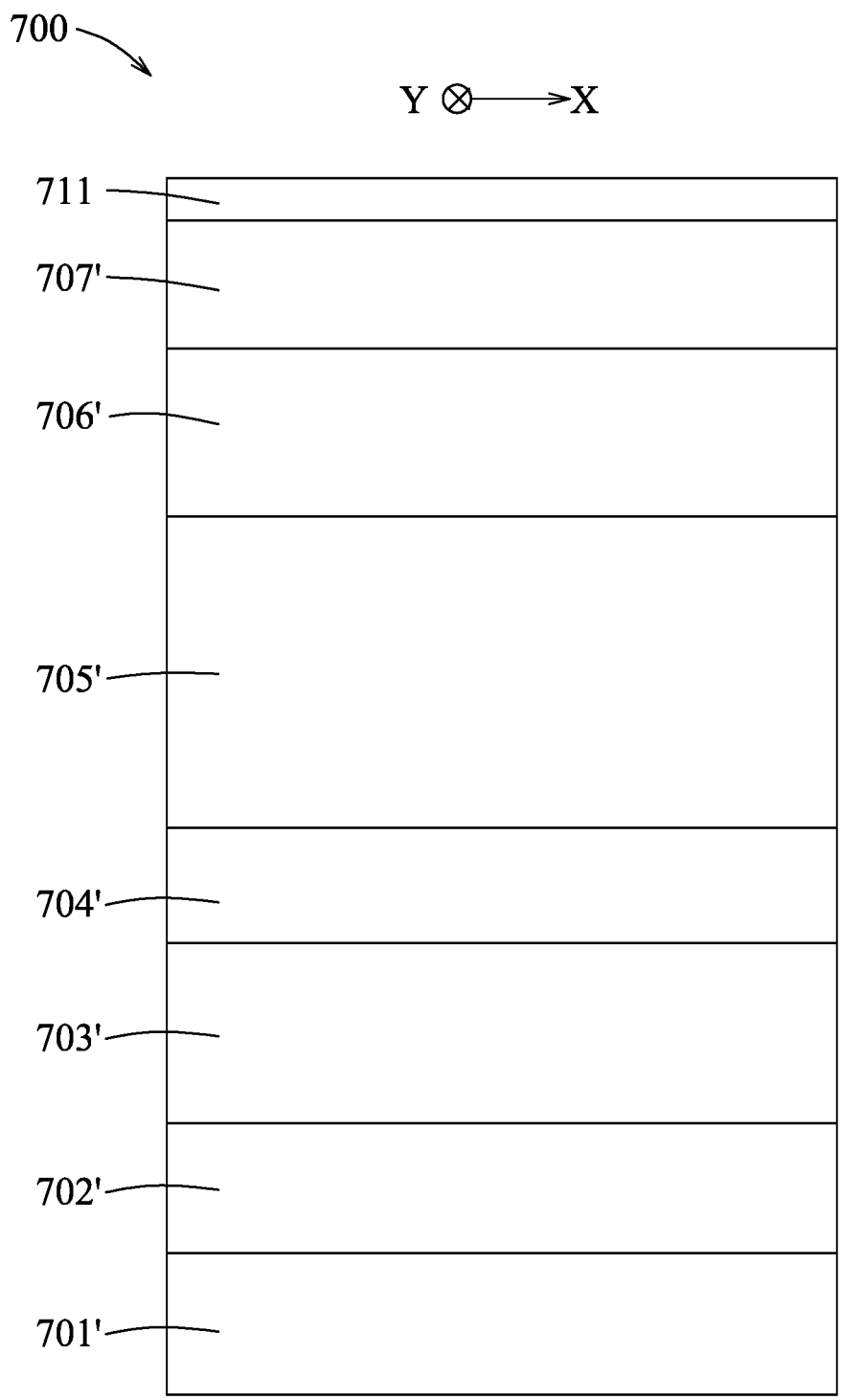
Figure 23:
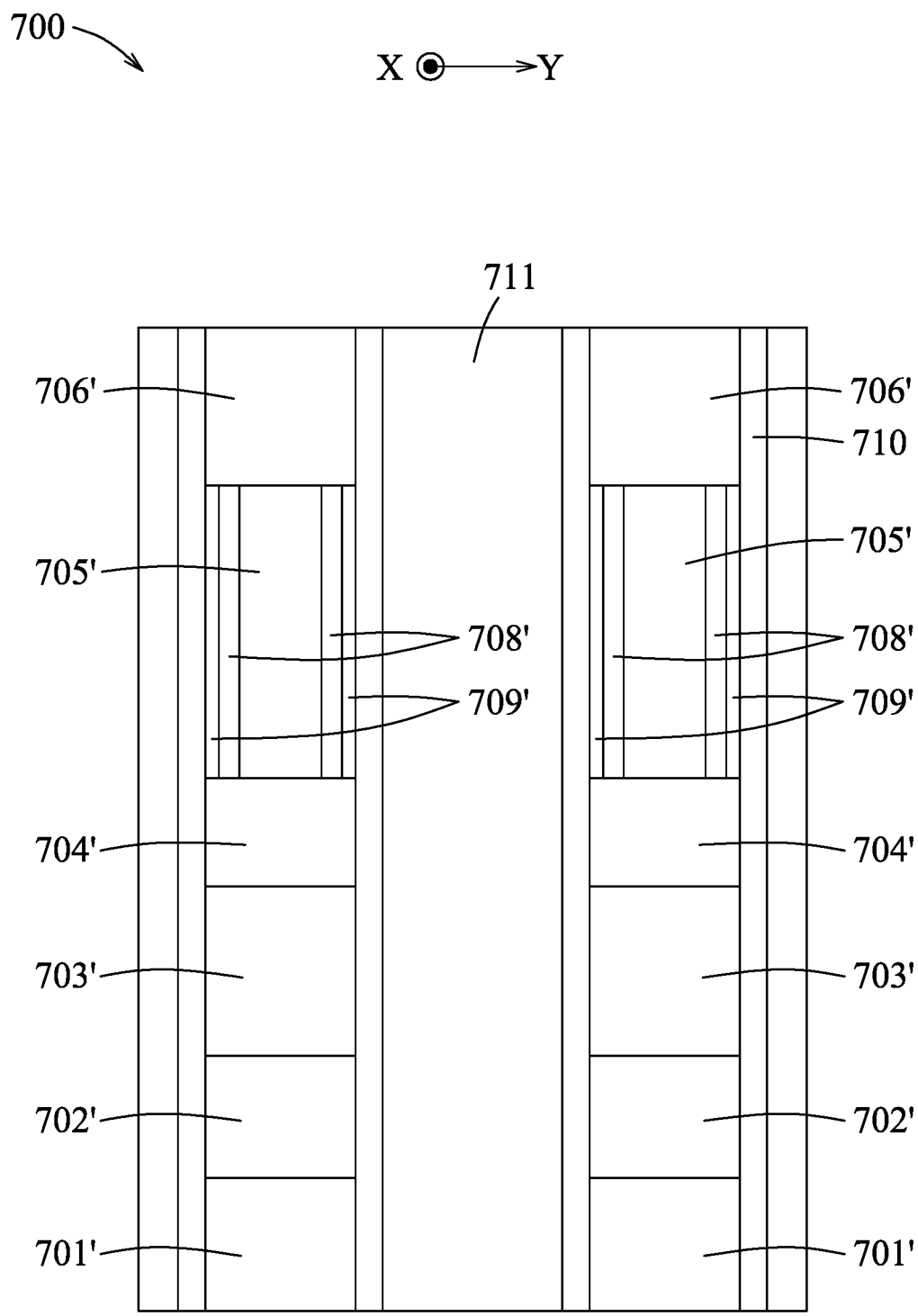
Figure 24:
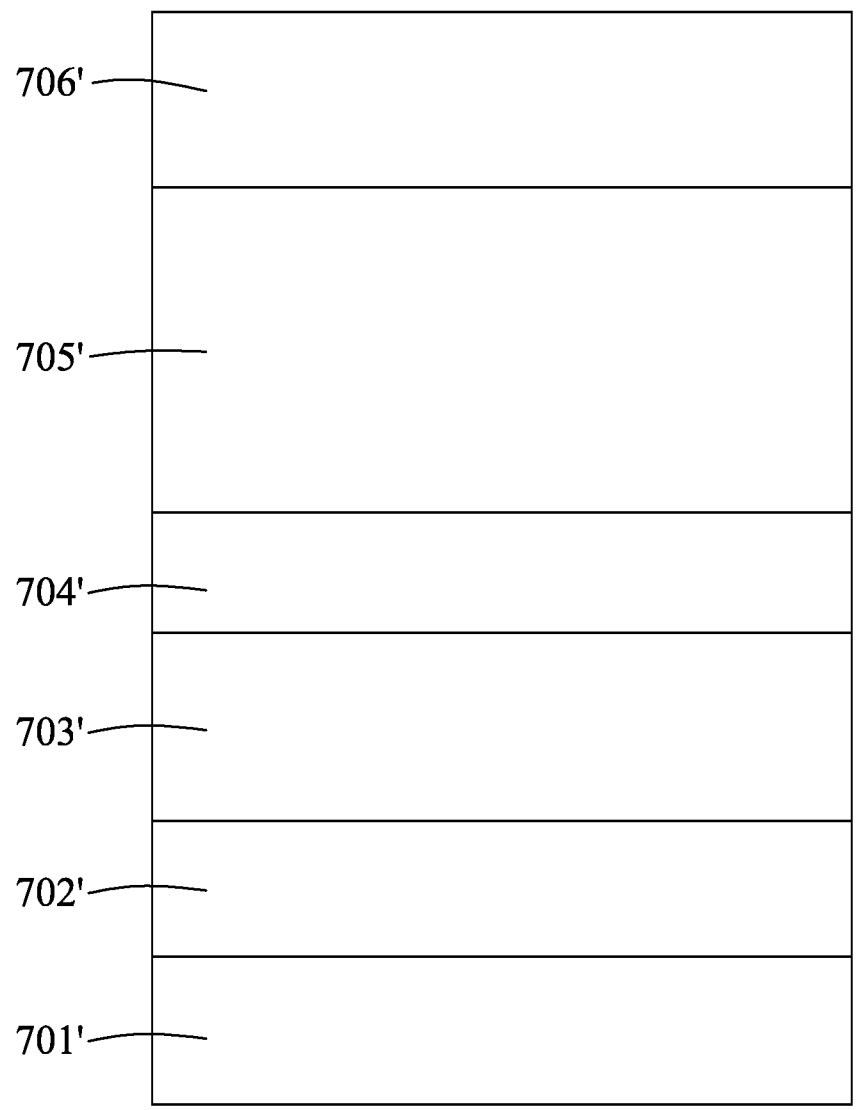
Figure 25:
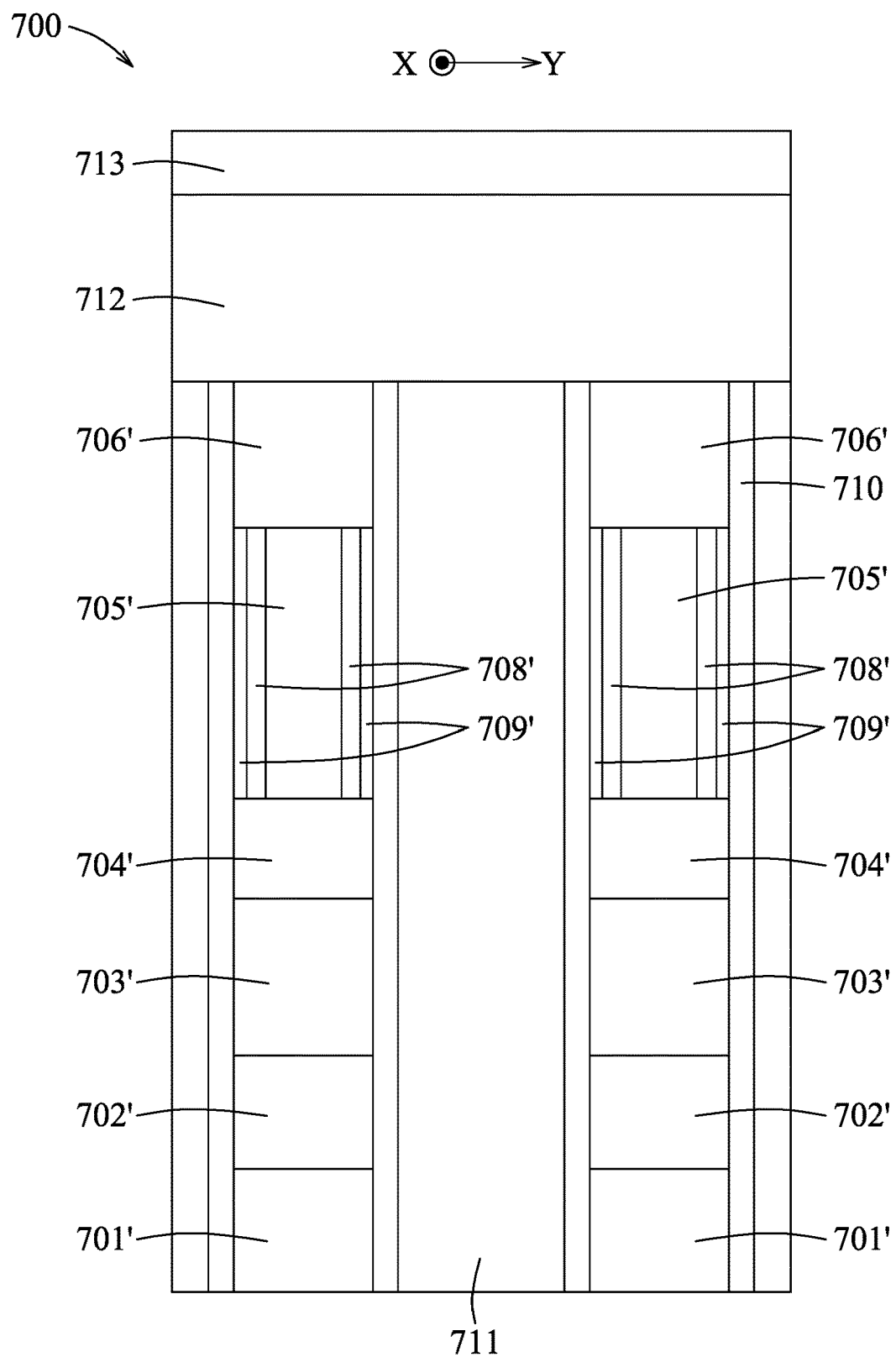
Figure 26:
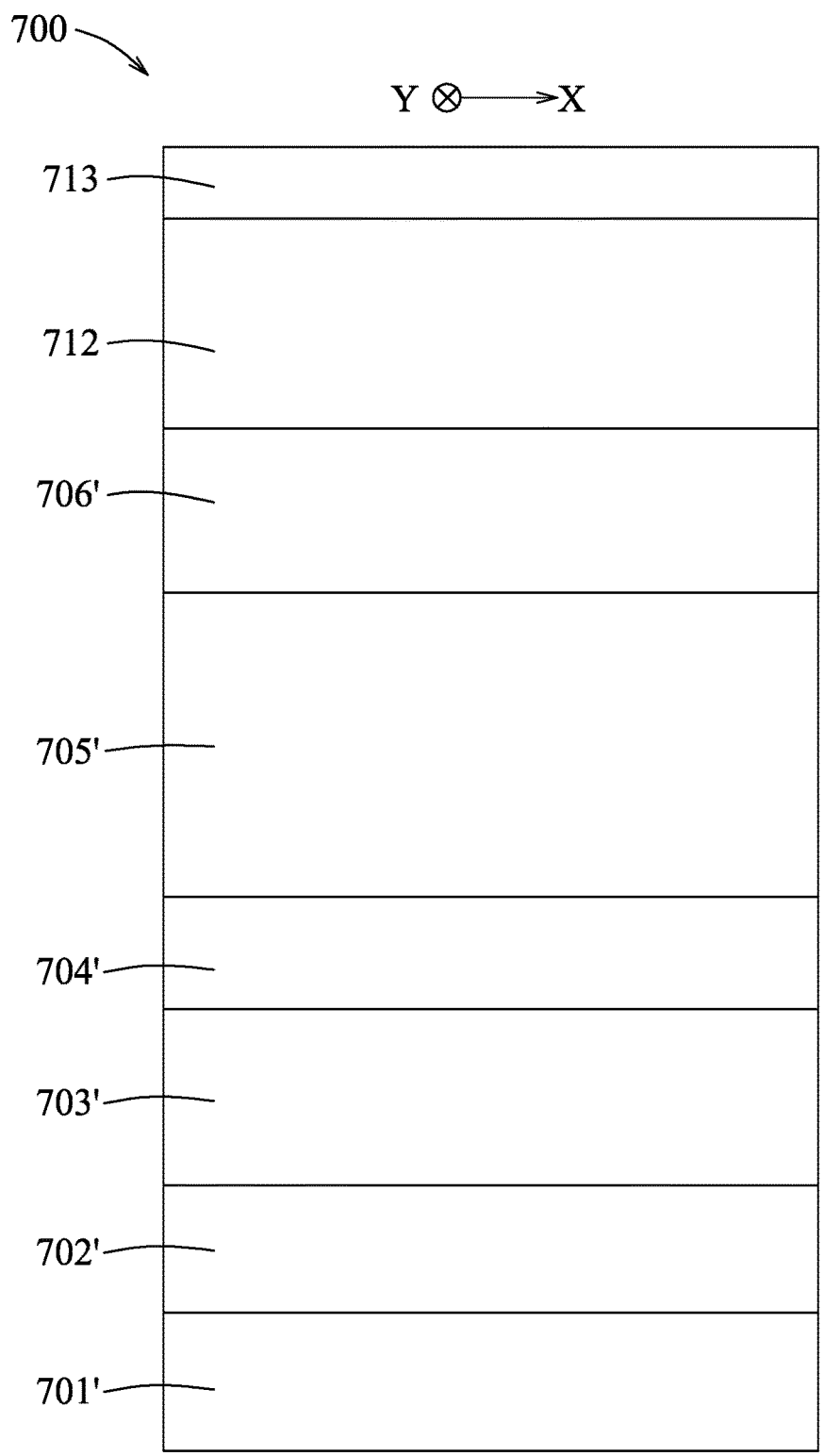
Figure 27:
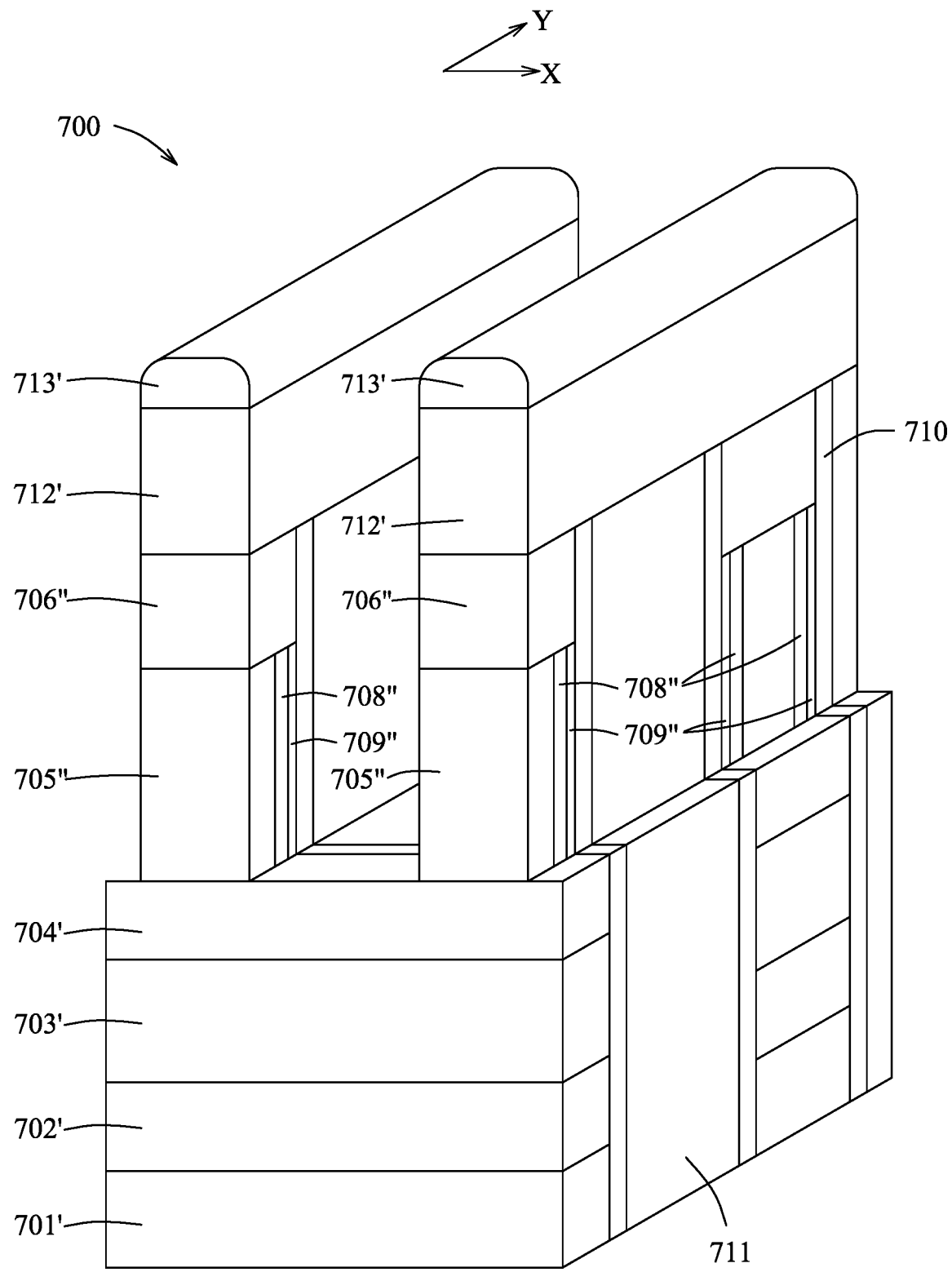
Figure 28:
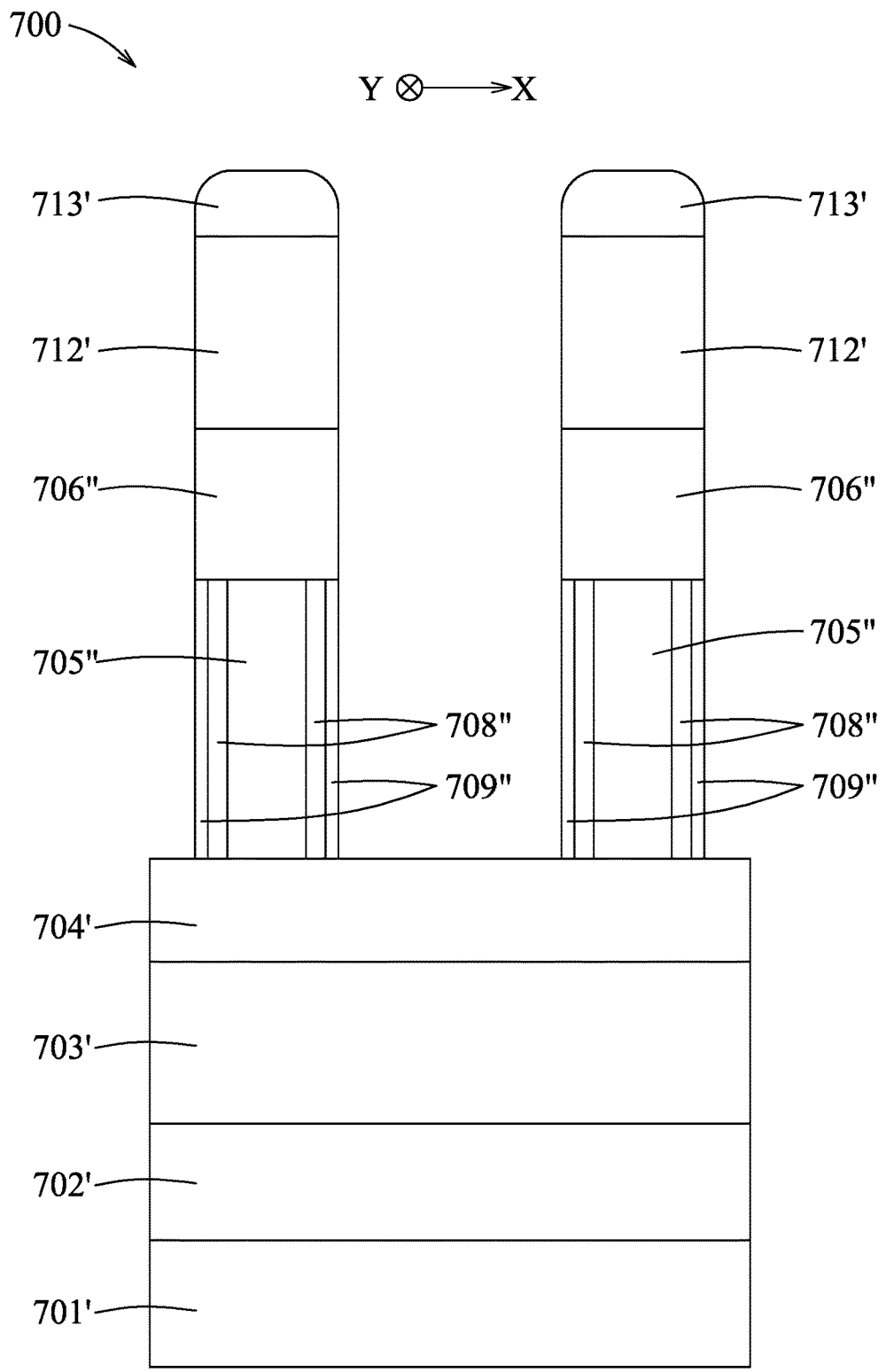
Figure 29:
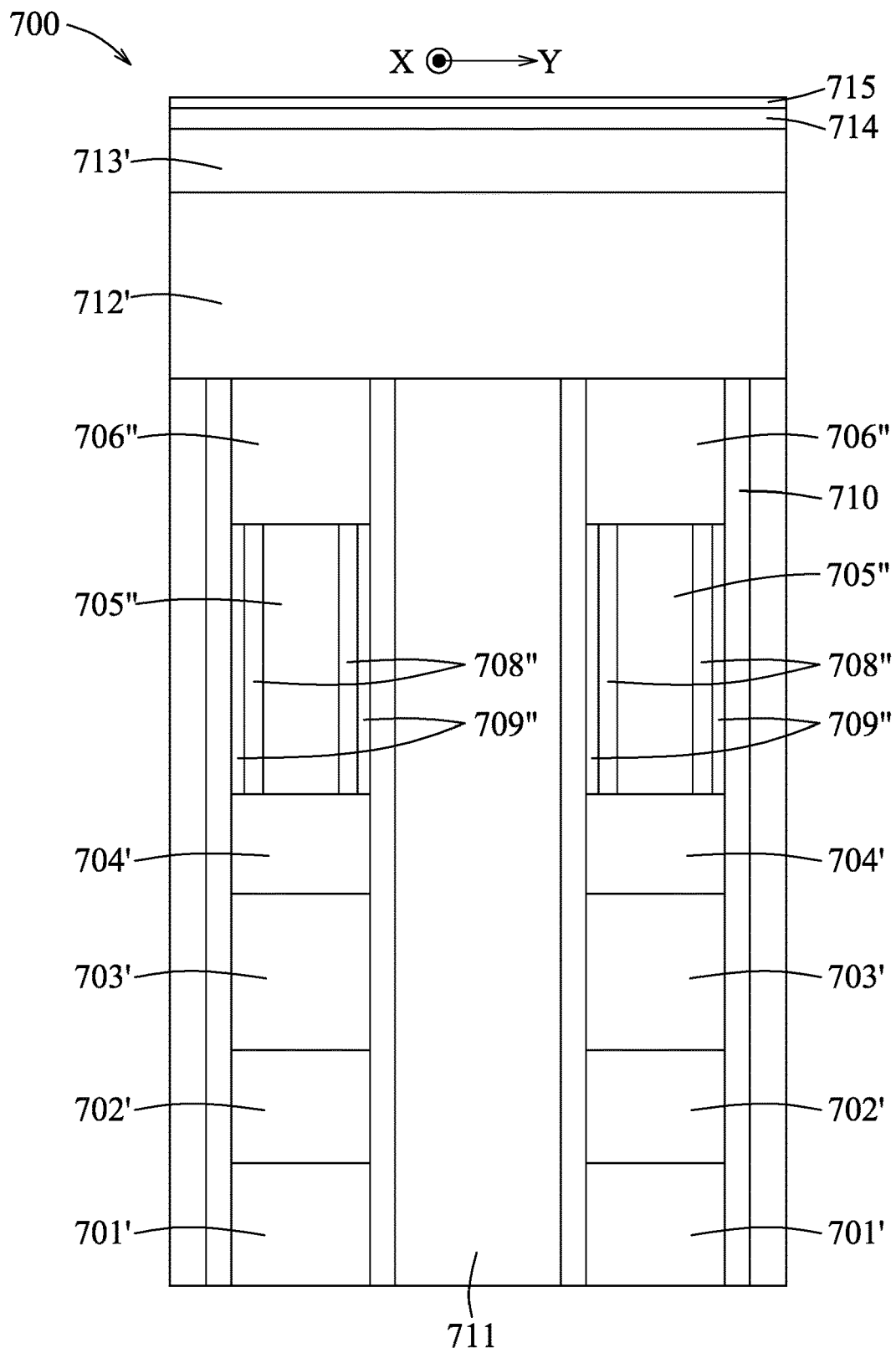
Figure 30:
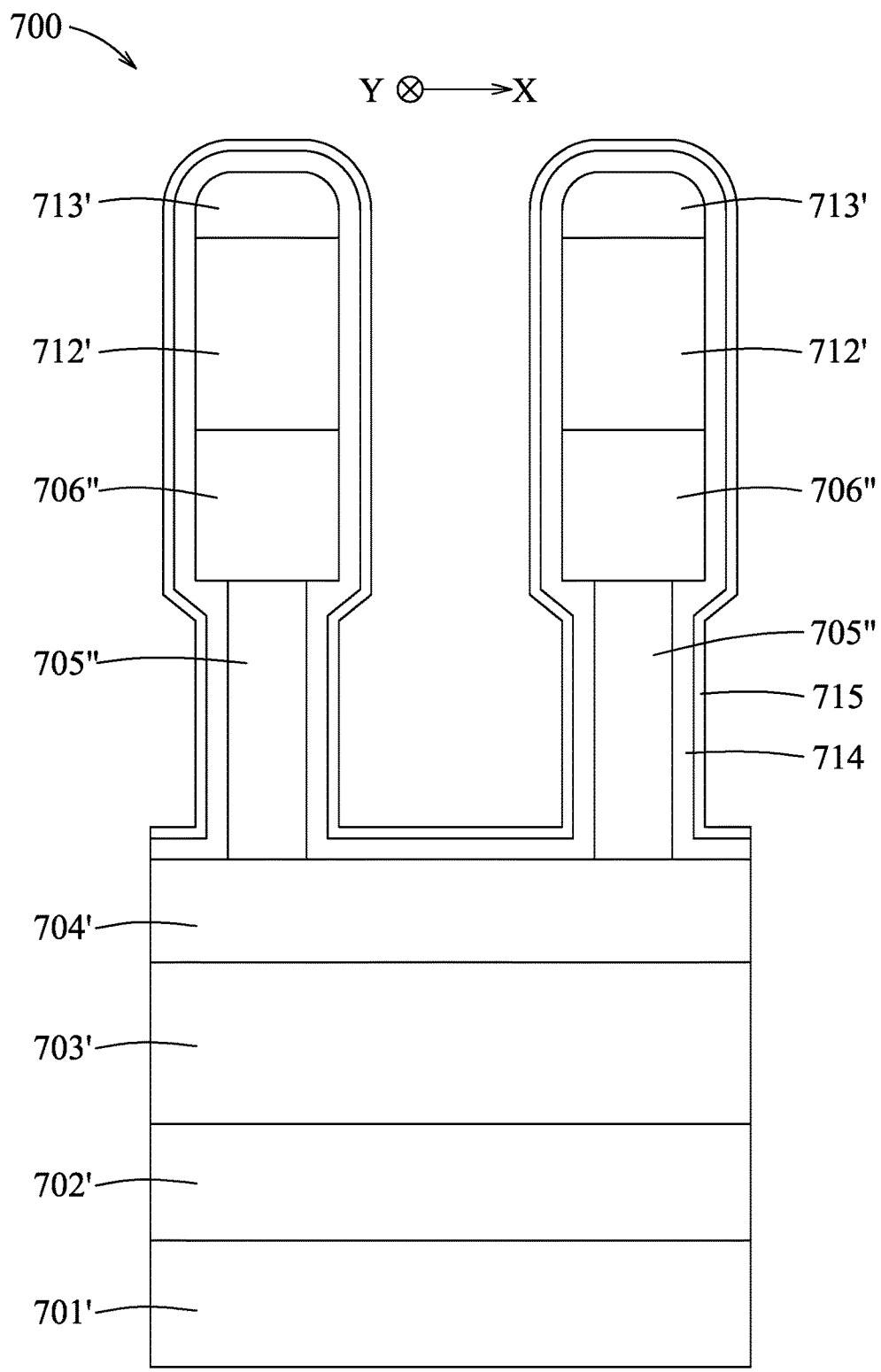
Figure 31:
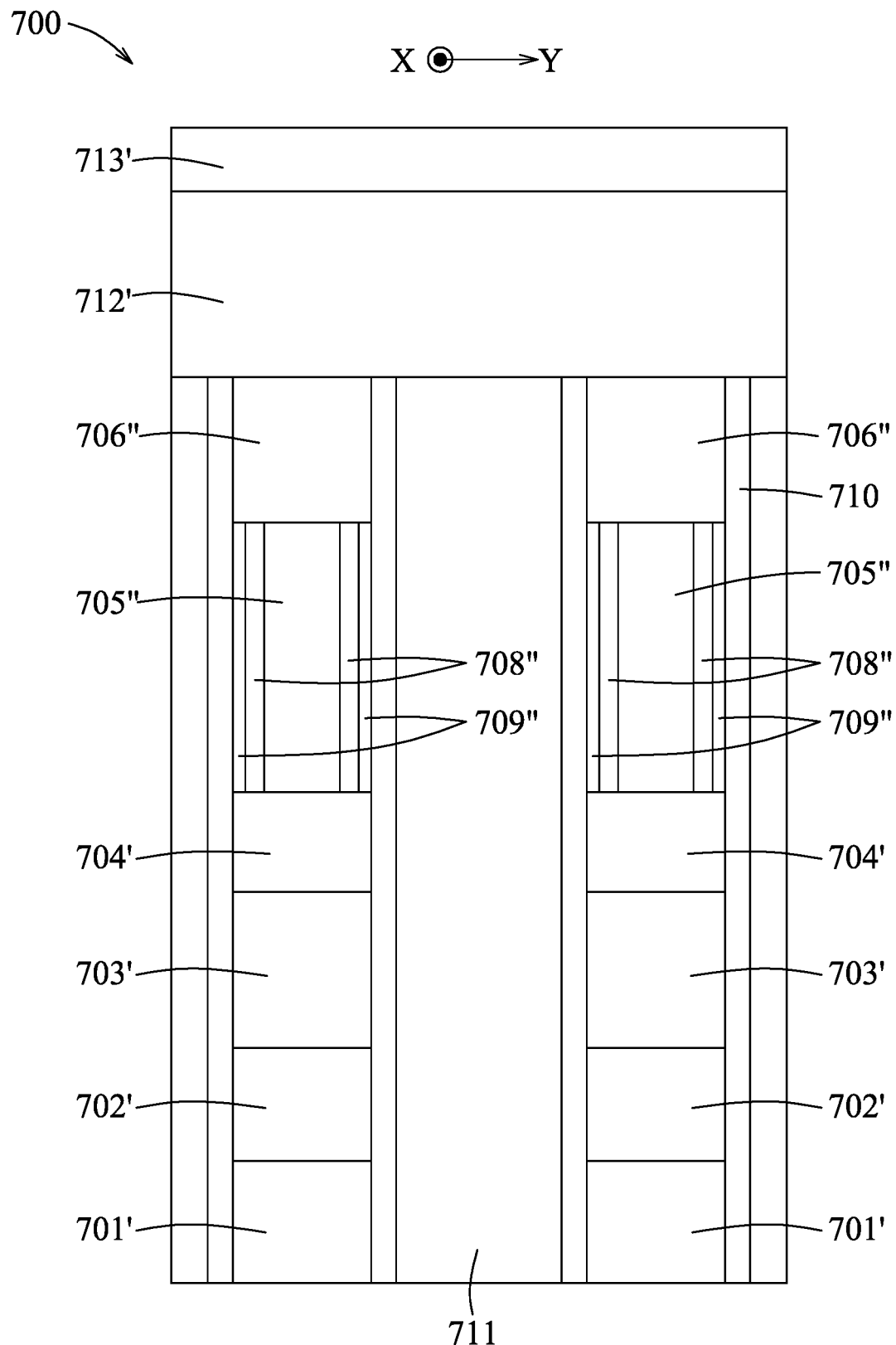
Figure 32:
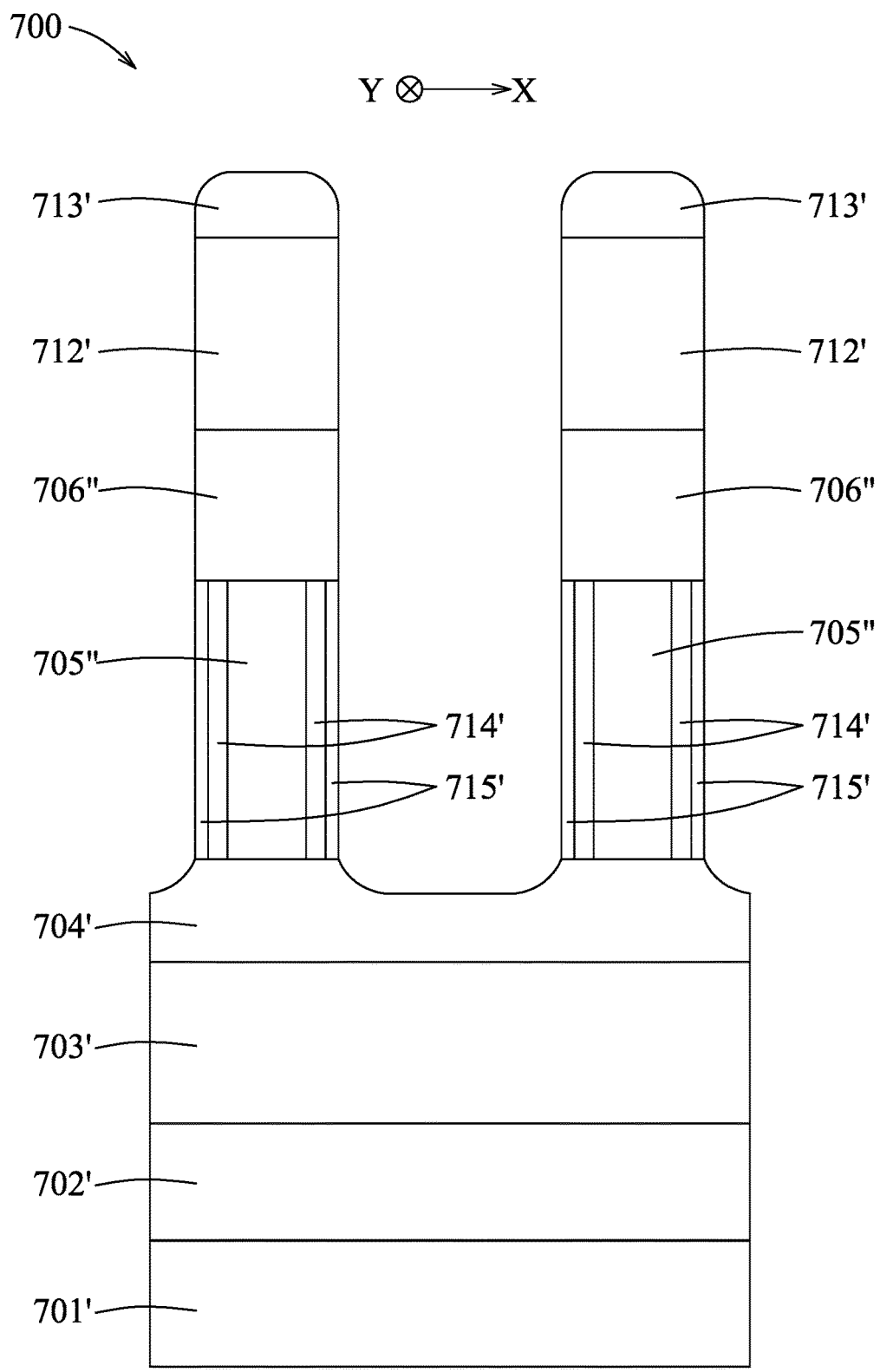
Figure 33:
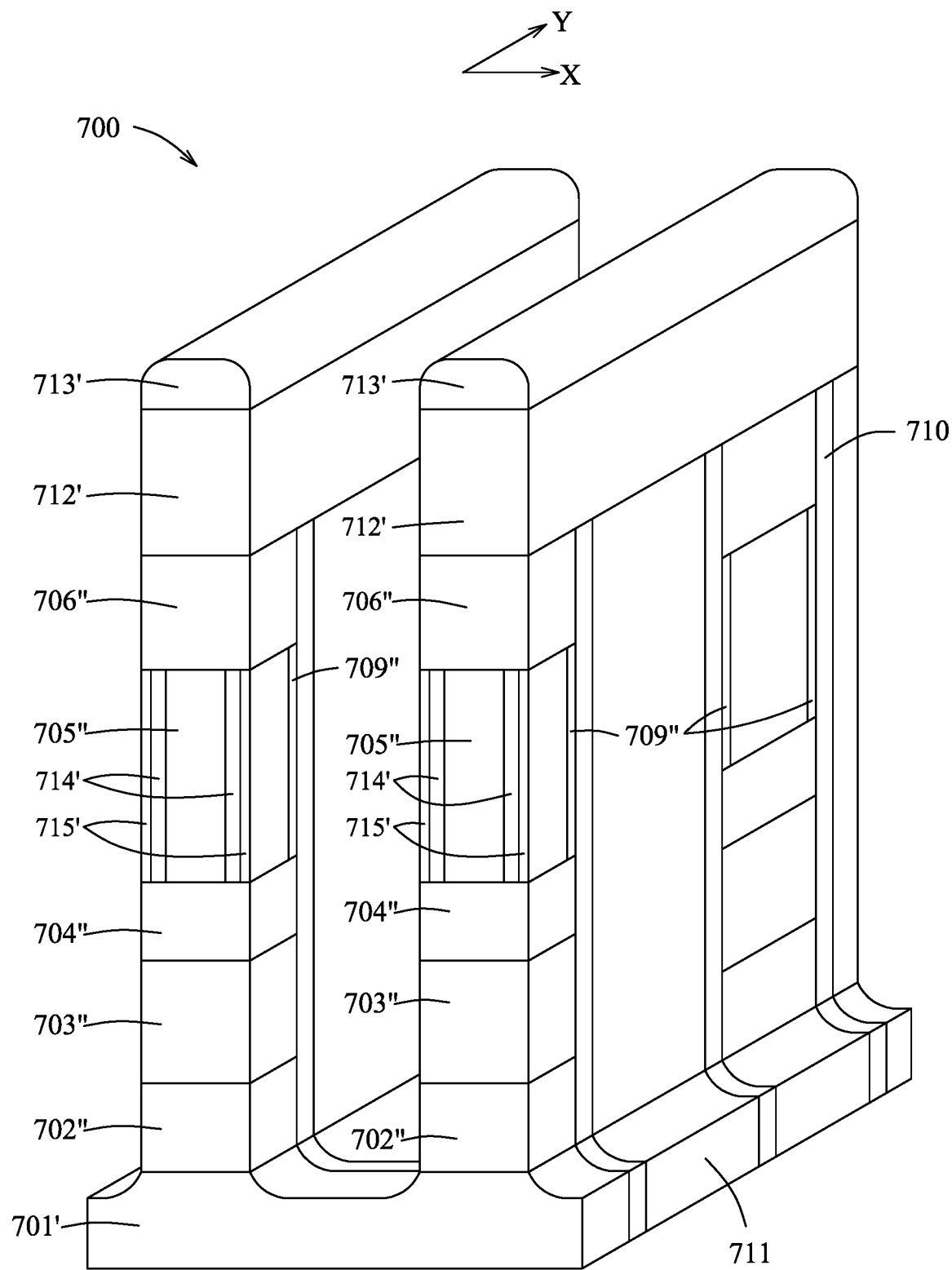
Figure 34:
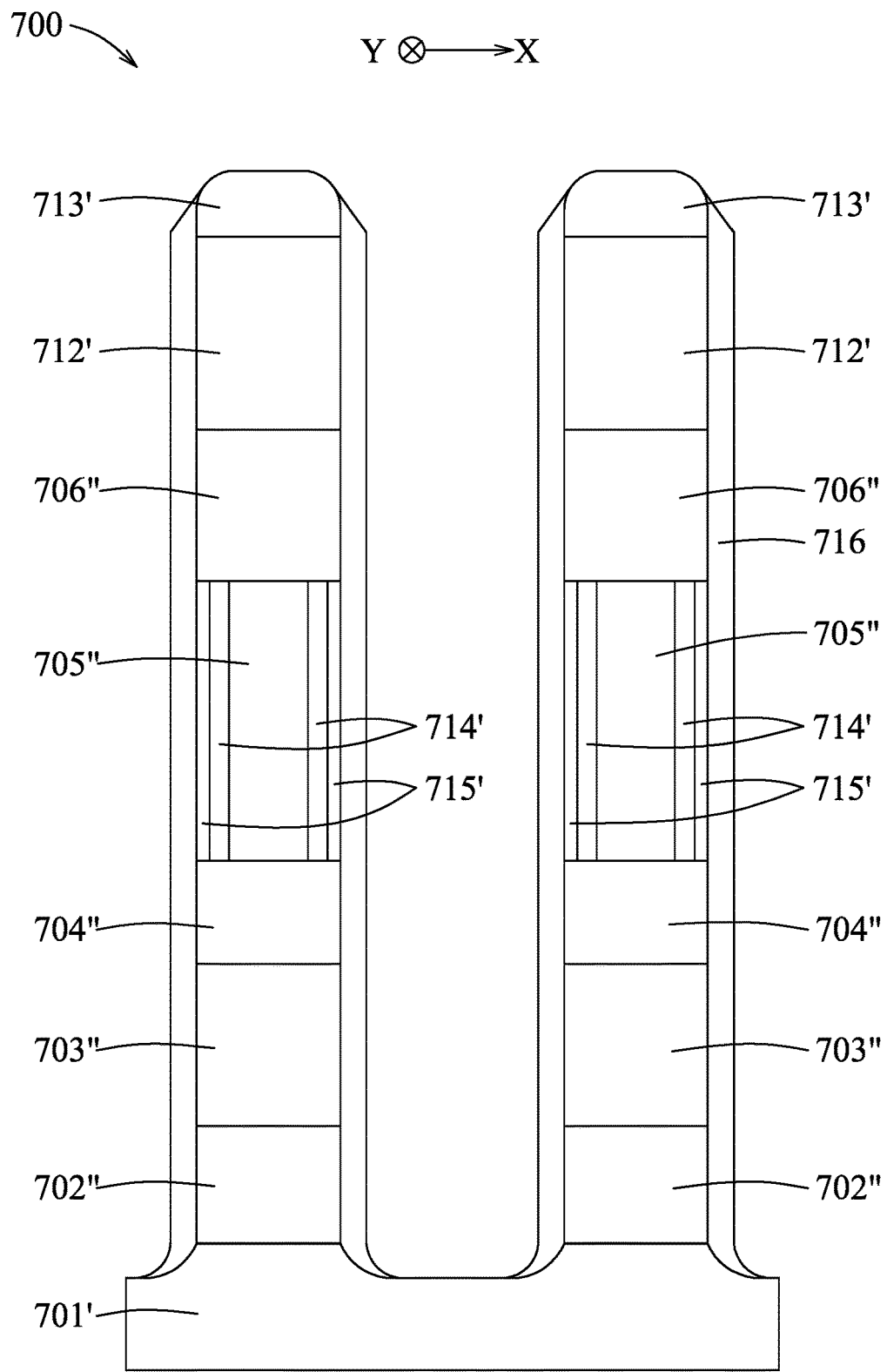
Figure 35:
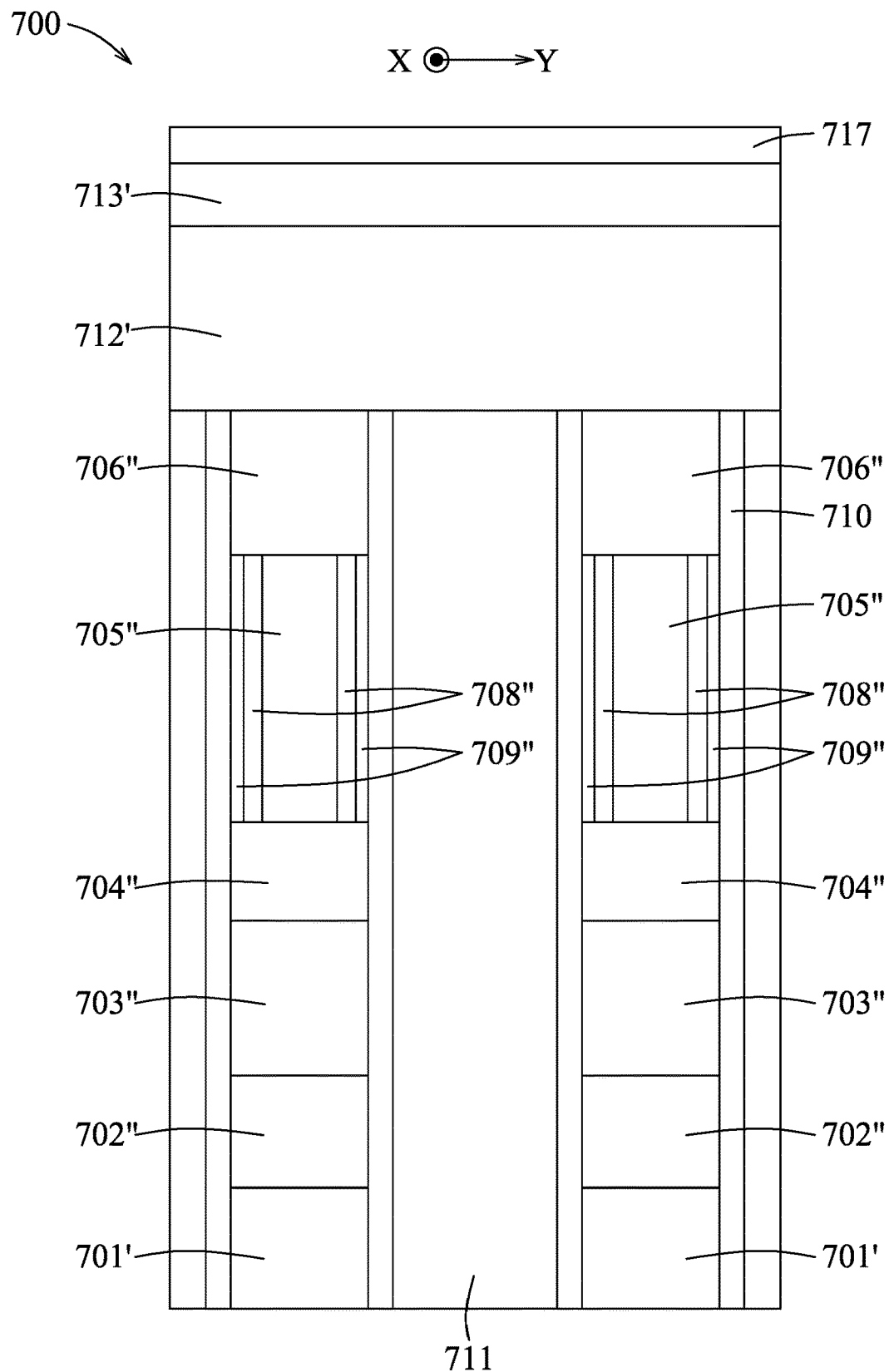
Figure 36:
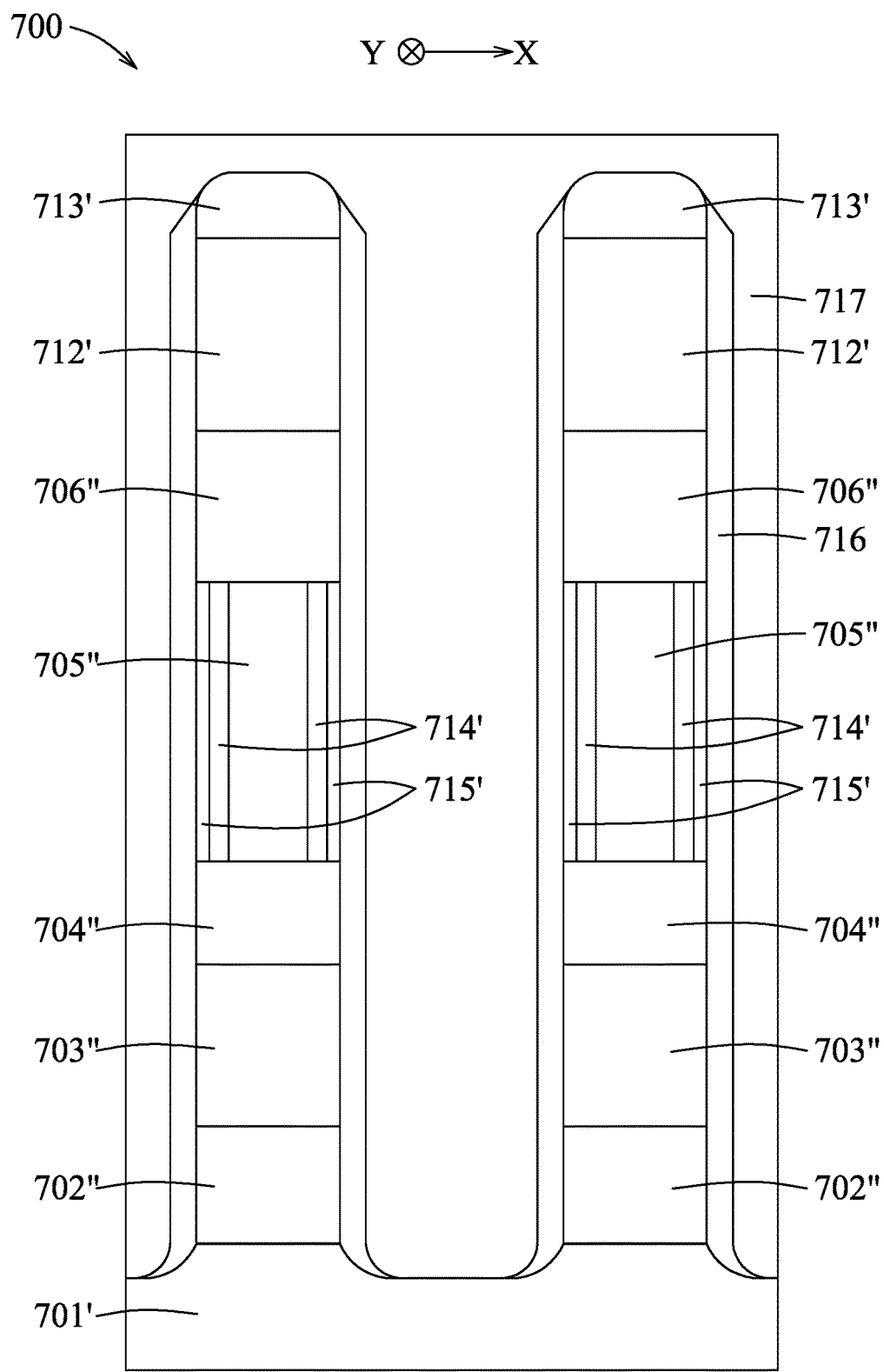
Figure 37:
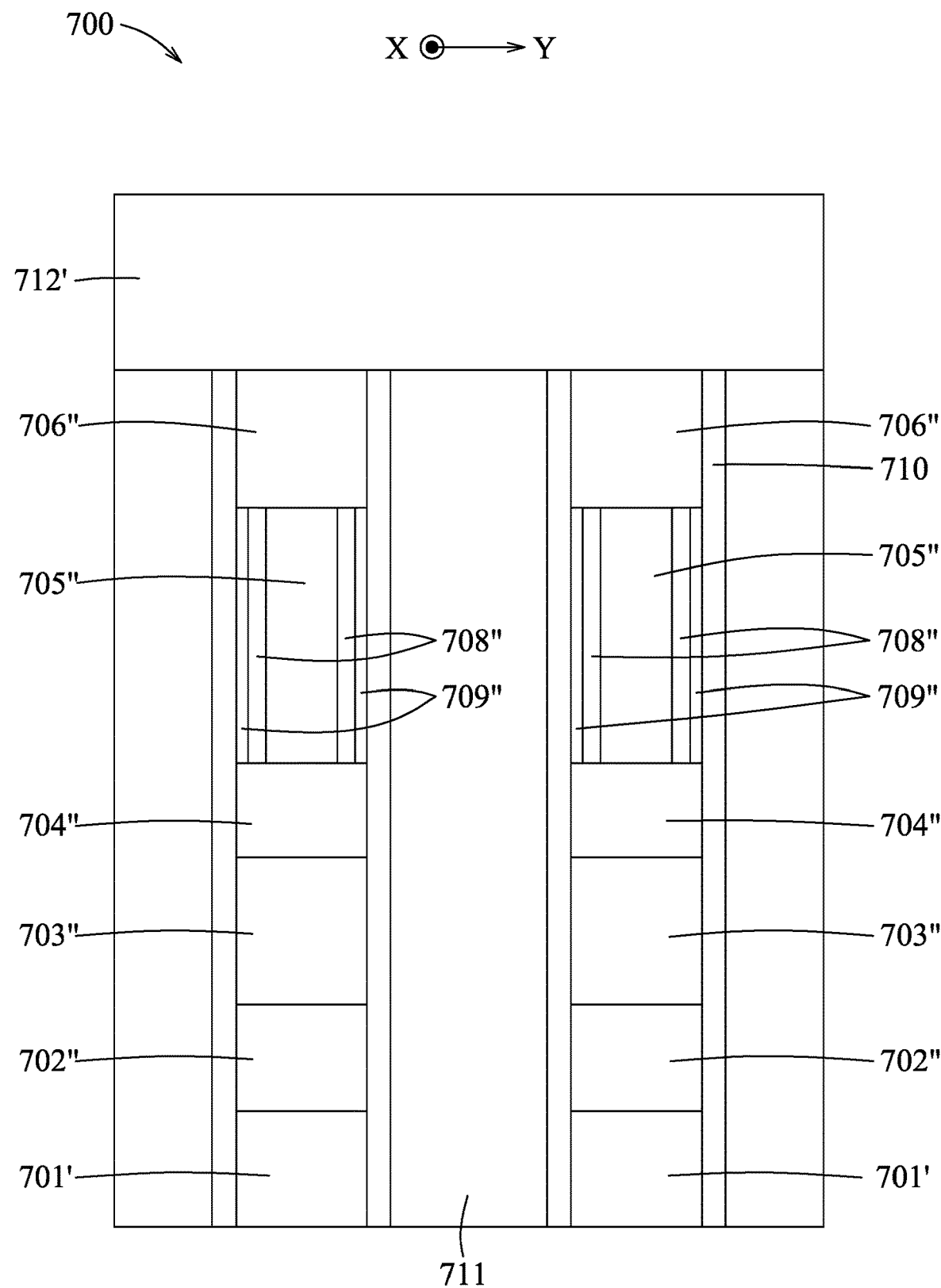
Figure 38:
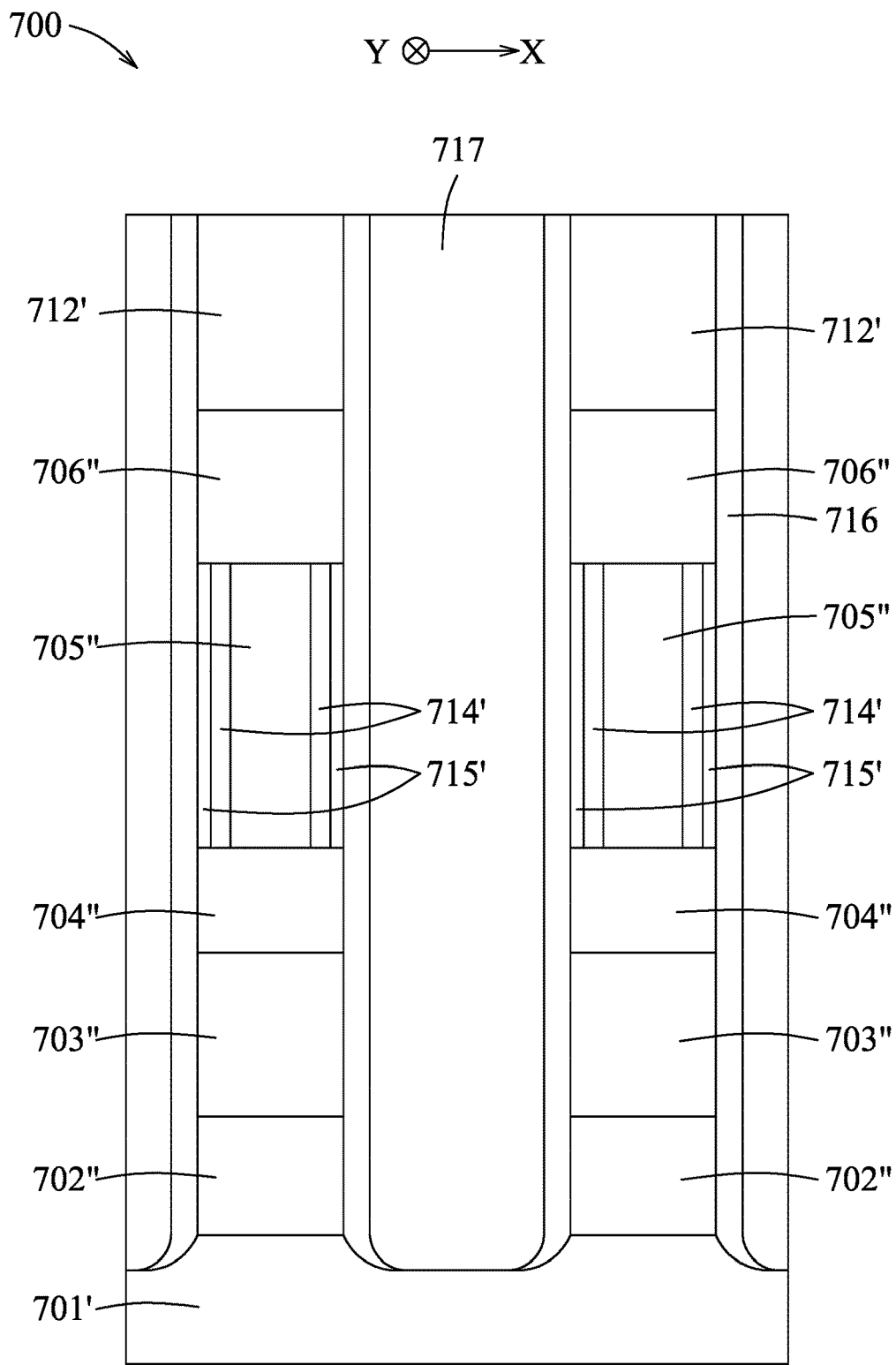

FIGS. 7 and 8 illustrate a method 600 for manufacturing a phase change memory device in accordance with some embodiments. FIGS. 9 to 38 are schematic sectional views of semiconductor structures 700 during various stages of the method 600. The method 600 and the semiconductor devices 700 are collectively described below. However, additional steps can be provided before, after or during the method 600, and some of the steps described herein may be replaced by other steps or be eliminated. Similarly, further additional features may be present in the semiconductor devices 700, and/or features present may be replaced or eliminated in additional embodiments.

Referring to FIG. 7, the method 600 begins at block 601, where a first conductive layer, a bottom electrode layer, a selector layer, a middle electrode layer, a phase change layer, a top electrode layer and a first hard mask layer are sequentially deposited on a substrate. In the example shown in FIGS. 9 and 10, a first conductive layer 701, a bottom electrode layer 702, a selector layer 703, a middle electrode layer 704, a phase change layer 705, a top electrode layer 706 and a first hard mask layer 707 are sequentially deposited on a substrate (not shown).

The first conductive layer 701, the bottom electrode layer 702, the selector layer 703, the middle electrode layer 704, the phase change layer 705, the top electrode layer 706 and the first hard mask layer 707 may be deposited by physical vapor deposition (PVD), chemical vapor deposition (CVD), atomic layer deposition (ALD), other suitable processes, or combinations thereof. The first conductive layer 701 may be made of copper (Cu), tungsten (W), aluminum (Al), silver (Ag), cobalt (Co), other suitable conductive materials, or combinations thereof. The bottom electrode layer 702, the middle electrode layer 704 and the top electrode layer 706 may each be made of carbon (C), tungsten (W), titanium nitride (TiN), other suitable conductive materials, or combinations thereof. The selector layer 703 may be made of a binary OTS material (for example but not limited to GeSe or BTe), a ternary OTS material (for example but not limited to GeSeN, GeSeSi, GeSeTe or AsGeSe), a quaternary OTS material (for example but not limited to TeAsGeSe, SiAsGeSe or SiGeAsTe), other suitable OTS materials, or combinations thereof. The bottom electrode layer 702, the middle electrode layer 704 and the top electrode layer 706 may be made of the same or different materials. The phase change layer 705 may be made of a binary phase change material (for example but not limited to GaSb, InSb, InSe, SbTe, GeTe or GeSb), a ternary phase change material (for example but not limited to GeSbTe, InSbTe, GaSbTe, SnSbTe, InSbGe or GaSbTe), a quaternary phase change material (for example but not limited to AgInSbTe, GeSnSbTe, GeSbSeTe, TeGeSbS, GeSbTeO or GeSbTeN), other suitable phase change materials, or combinations thereof. The first hard mask layer 707 may be made of silicon oxycarbide (SiOC), silicon oxynitride (SiON), silicon nitride (SiN), other suitable dielectric materials, or combinations thereof.

Referring to FIG. 7, the method 600 then proceeds to block 602, where the first hard mask layer, the top electrode layer and the phase change layer are recessed to form a plurality of first hard mask strips, a plurality of top electrode strips, and a plurality of phase change strips that extend in a first direction. The first hard mask strips are respectively aligned with the top electrode strips, and are respectively aligned with the phase change strips. In the example shown in FIGS. 11 and 12, the first hard mask layer 707 is patterned using photolithography and photoresist developing technology as is known to those skilled in the art of semiconductor fabrication, so as to form a plurality of first hard mask strips 707' which extend in an X direction. The pattern formed in the first hard mask layer 707 is then transferred to the top electrode layer 706 and the phase change layer 705 by an etching process (for example but not limited to wet etching, dry etching, or a combination thereof) to form a plurality of top electrode strips 706' and a plurality of phase change strips 705' which extend in the X direction. The first hard mask strips 707' are respectively aligned with the top electrode strips 706', and are respectively aligned with the phase change strips 705'.

Referring to FIG. 7, the method 600 then proceeds to block 603, where each of the phase change strips is laterally recessed in a second direction different from (e.g., transverse to) the first direction. In the example shown in FIGS. 11 and 13, each of the phase change strips 705' is laterally recessed in a Y direction traverse to the X direction by an isotropic etching process (for example but not limited to wet etching, dry etching, or a combination thereof) to remove side portions of the phase change strip 705'.

Referring to FIG. 7, the method 600 then proceeds to block 604, where a first spacer layer and a second spacer layer are sequentially and conformally deposited. In the example shown in FIGS. 14 and 15, a first spacer layer 708 and a second spacer layer 709 are sequentially and conformally deposited to cover the first hard mask strips 707', the top electrode strips 706', the phase change strips 705' and the middle electrode layer 704. The conformal deposition may be implemented by a suitable deposition process as is known to those skilled in the art of semiconductor fabrication (for example but not limited to PVD, CVD, ALD, or combinations thereof). The second spacer layer 709 has a thermal conductivity smaller than that of the first spacer layer 708. The first spacer layer 708 and the second spacer layer 709 may each be made of silicon carbon (SiC), silicon oxide (SiO), silicon nitride (SiN), silicon oxycarbide (SiOC), SiLK® (Dow Chemical, Midland, Mich.), other suitable dielectric materials, or combinations thereof. In some embodiments, the first spacer layer 708 is made of SiN, and the second spacer layer 709 is made of SiOC or SiLK®. In some other embodiments, the first spacer layer 708 is made of SiN; the second spacer layer 709 includes at least one first layer, and at least one second layer that is different from the at least one first layer in terms of lattice arrangement and that is arranged alternatingly with the at least one first layer; the at least one first layer is made of SiO or SiOC; and the at least one second layer is made of SiN or SiC.

Referring to FIG. 7, the method 600 then proceeds to block 605, where the second spacer layer and the first spacer layer are etched to form a plurality of first spacer strips and a plurality of second spacer strips. Each of the phase change strips is covered laterally by two of the first spacer strips along the first direction, and each of the first spacer strips is covered by a respective one of the second spacer strips along the first direction. In the example shown in FIGS. 14 to 17, the second spacer layer 709 and the first spacer layer 708 are anisotropically etched to leave the portions of the first and second spacer layers 708, 709 that laterally cover the phase change strips 705' along the X direction. The remained portions of the first spacer layer 708 are referred to as first spacer strips 708' and the remained portions of the second spacer layer 709 are referred to as second spacer strips 709', and each of the phase change strips 705' is covered laterally by two of the first spacer strips 708', and each of the first spacer strips 708' is covered by a respective one of the second spacer strips 709'.

Referring to FIG. 7, the method 600 then proceeds to block 606, where the middle electrode layer, the selector layer, the bottom electrode layer and the first conductive layer are recessed to form a plurality of middle electrode strips, a plurality of selector strips, a plurality of bottom electrode strips and a plurality of first conductive strips that extend in the first direction. The middle electrode strips are respectively aligned with the phase change strips, are respectively aligned with the selector strips, are respectively aligned with the bottom electrode strips and are respectively aligned with the first conductive strips. In the example shown in FIGS. 18 and 19, the pattern formed in the first hard mask layer 707 is transferred to the middle electrode layer 704, the selector layer 703, the bottom electrode layer 702 and the first conductive layer 701 by an etching process (for example but not limited to wet etching, dry etching, or a combination thereof) to form a plurality of middle electrode strips 704', a plurality of selector strips 703', a plurality of bottom electrode strips 702' and a plurality of first conductive strips 701' that extend in the first direction. The middle electrode strips 704' are respectively aligned with the phase change strips 705', are respectively aligned with the selector strips 703', are respectively aligned with the bottom electrode strips 702' and are respectively aligned with the first conductive strips 701'. Each of the first conductive strips 701' would serve as a corresponding one of the first conductive lines 1 (see FIG. 4).

Referring to FIG. 7, the method 600 then proceeds to block 607, where an outside spacer layer is formed. In the example shown in FIGS. 19 and 20, an outside spacer layer 710 is conformally deposited, and is then anisotropically etched to remove horizontal portions thereof, so as to laterally cover the first hard mask strips 707', the top electrode strips 706', the second spacer strips 709', the middle electrode strips 704', the selector strips 703', the bottom electrode strips 702' and the first conductive strips 701' along the X direction. The outside spacer layer 710 may be made of SiC, SiO, SiN, SiOC, SiLK®, other suitable dielectric materials, or combinations thereof, and optionally has air-filled voids. In some embodiments, the outside spacer layer 710 is an air gap.

Referring to FIG. 7, the method 600 then proceeds to block 608, where an insulator layer is formed. In the example shown in FIGS. 21 and 22, an insulator layer 711 is deposited to cover the first hard mask strips 707', the outside spacer layer 710 and the substrate (not shown). The insulator layer 711 may be made of SiC, SiO, SiN, SiOC, SiLK®, other suitable dielectric materials, or combinations thereof, and optionally has air-filled voids. The outside spacer layer 710 and the insulator layer 711 may be made of the same or different material. In some embodiments, the insulator layer 711 is an air gap.

Referring to FIG. 7, the method 600 then proceeds to block 609, where the semiconductor structure is planarized. In the example shown in FIGS. 21 to 24, the semiconductor device 700 is subjected to a planarization process (e.g., chemical mechanical planarization (CMP)) to remove an excess portion of the insulator layer 711, portions of the outside spacer layer 710 and the first hard mask strips 707' until top surfaces of the top electrode strips 706' are exposed.

Referring to FIG. 8, the method 600 then proceeds to block 610, where a second conductive layer and a second hard mask layer are sequentially deposited. In the example shown in FIGS. 25 and 26, a second conductive layer 712 is deposited to cover the top electrode strips 706', the outside spacer layer 710 and the insulator layer 711, and a second hard mask layer 713 is then deposited on the second conductive layer 712. The second conductive layer 712 may be made of copper (Cu), tungsten (W), aluminum (Al), silver (Ag), cobalt (Co), other suitable conductive materials, or combinations thereof. The first conductive layer 701 and the second conductive layer 712 may be made of the same or different material. The second hard mask layer 713 may be made of silicon oxycarbide (SiOC), silicon oxynitride (SiON), silicon nitride (SiN), other suitable dielectric materials, or combinations thereof.

Referring to FIG. 8, the method 600 then proceeds to block 611, where the second hard mask layer, the second conductive layer, the top electrode strips, the outside spacer layer, the insulator layer, the phase change strips, the first spacer strips and the second spacer strips are recessed to form a plurality of second hard mask strips, and a plurality of second conductive strips that extend in the second direction, where the second hard mask strips are respectively aligned with the second conductive strips, and to form a plurality of top electrodes, a plurality of phase change regions, a plurality of first spacer elements, and a plurality of second spacer elements, where the top electrodes are respectively aligned with the phase change regions, each of the phase change regions is covered laterally by two of the first spacer elements, and each of the first spacer elements is covered by a respective one of the second spacer elements. In the example shown in FIG. 27, the second hard mask layer 713 is patterned using photolithography and photoresist developing technology as is known to those skilled in the art of semiconductor fabrication, so as to form a plurality of second hard mask strips 713' that extend in the Y direction. The pattern formed in the second hard mask layer 713 is then transferred downward by an etching process (for example but not limited to wet etching, dry etching, or a combination thereof) until top surfaces of the middle electrode strips 704' are exposed, so as to form a plurality of second conductive strips 712' that extend in the Y direction and that are aligned with the second hard mask strips 713', and to form a plurality of top electrodes 706", a plurality of phase change regions 705", a plurality of first spacer elements 708" and a plurality of second spacer elements 709". The top electrodes 706" are respectively aligned with the phase change regions 705", each of the phase change regions 705" is covered laterally by two of the first spacer elements 708", and each of the first spacer elements 708" is covered by a respective one of the second spacer elements 709". Each of the top electrodes 706" would serve as the top electrode 35 of a corresponding one of the memory cells 3 (see FIG. 4). Each of the second conductive strips 712' would serve as a corresponding one of the second conductive lines 2 (see FIG. 5).

Referring to FIG. 8, the method 600 then proceeds to block 612, where the phase change regions are laterally recessed in the first direction. In the example shown in FIGS. 27 and 28, each of the phase change regions 705" is laterally recessed in the X direction by an isotropic etching process (for example but not limited to wet etching, dry etching, or a combination thereof) to remove side portions of the phase change regions 705". Each of the phase change regions 705" would serve as the phase change regions 34 of a corresponding one of the memory cells 3 (see FIG. 4).

Referring to FIG. 8, the method 600 then proceeds to block 613, where another first spacer layer and another second spacer layer are sequentially and conformally deposited. In the example shown in FIGS. 29 and 30, another first spacer layer 714 and another second spacer layer 715 are sequentially and conformally deposited to cover at least the second hard mask strips 713', the second conductive strips 712', the top electrodes 706", and the phase change regions 705". The conformal deposition may be implemented by a suitable deposition process as is known to those skilled in the art of semiconductor fabrication (e.g., PVD, CVD, ALD, other suitable processes, or combinations thereof). The first spacer layers 708, 714 are made of the same material. The second spacer layers 709, 715 are made of the same material.

Referring to FIG. 8, the method 600 then proceeds to block 614, where the another second spacer layer and the another first spacer layer are etched to form a plurality of another first spacer elements and a plurality of another second spacer elements. Each of the phase change regions is covered laterally by two of the another first spacer elements along the second direction, and each of the another first spacer strips is covered by a respective one of the another second spacer elements along the second direction. In the example shown in FIGS. 29 to 32, the another second spacer layer 715 and the another first spacer layer 714 are aniso-tropically etched to leave the portions of the another first and second spacer layers 714, 715 that laterally cover the phase change regions 705" along the Y direction. The remained portions of the first spacer layer 714 are referred to as first spacer elements 714' and the remained portions of the second spacer layer 715 are referred to as second spacer elements 715', and each of the phase change regions 705" is covered laterally by two of the first spacer elements 714', and each of the first spacer elements 714' is covered by a respective one of the second spacer elements 715'. Four of the first spacer elements 708", 714' that laterally cover the same one of the phase change regions 705" cooperatively form a first spacer that would serve as the first spacer 36 of a corresponding one of the memory cells 3 (see FIG. 4). Four of the second spacer elements 709", 715' that laterally cover the same first spacer cooperatively form a second spacer that would serve as the second spacer 37 of a corresponding one of the memory cells 3 (see FIG. 4).

Referring to FIG. 8, the method 600 then proceeds to block 615, where the middle electrode strips, the selector strips, the bottom electrode strips, the outside spacer layer and the insulator layer are recessed to form a plurality of middle electrodes, a plurality of selectors, and a plurality of bottom electrodes, where the middle electrodes are respectively aligned with the phase change regions, are respectively aligned with the selectors and are respectively aligned with the bottom electrodes. In the example shown in FIG. 33, the pattern formed in the second hard mask layer 713 is transferred further downward by an etching process (for example but not limited to wet etching, dry etching, or a combination thereof) until top surfaces of the first conductive strips 701' are exposed to form a plurality of middle electrodes 704", a plurality of selectors 703", and a plurality of bottom electrodes 702", where the middle electrodes 704" are respectively aligned with the phase change regions 705''', are respectively aligned with the selectors 703" and are respectively aligned with the bottom electrodes 702". Each of the middle electrodes 704", an aligned one of the selectors 703" and an aligned one of the bottom electrodes 702" would serve as the middle electrode 33, the selector 32 and the bottom electrode 31 of a corresponding one of the memory cells 3 (see FIG. 4).

Referring to FIG. 8, the method 600 then proceeds to block 616, where another outside spacer layer is formed. In the example shown in FIGS. 33 and 34, another outside spacer layer 716 is conformally deposited, and is then anisotropically etched to remove horizontal portions thereof, so as to laterally cover the second hard mask strips 713', the second conductive strips 712', the top electrodes 706", the second spacer elements 709", 715', the middle electrodes 704", the selectors 703", the bottom electrodes 702", the outside spacer layer 710, and the insulator layer 711 along the Y direction. The outside spacer layers 710, 716 are made of the same material.

Referring to FIG. 8, the method 600 then proceeds to block 617, where another insulator layer is formed. In the example shown in FIGS. 35 and 36, another insulator layer 717 is deposited to cover the second hard mask strips 713', the another outside spacer layer 716 and the first conductive strips 701'. The insulator layers 711, 717 are made of the same material.

Referring to FIG. 8, the method 600 then proceeds to block 618, where the semiconductor device is planarized. In the example shown in FIGS. 35 to 38, the semiconductor device 700 is subjected to a planarization process (for example but not limited to CMP) to remove an excess portion of the another insulator layer 717, portions of the another outside spacer layer 716 and the second hard mask strips 713' until top surfaces of the second conductive strips 712' are exposed. The outside spacer layers 710, 716 cooperatively form a plurality of outside spacers that would respectively serve as the outside spacers 4 (see FIG. 4). The insulator layers 711, 717 cooperatively form an insulator that would serve as the insulator 5 (see FIG. 4).

Referring back to FIGS. 3 to 5, in some embodiments, for each of the memory cells 3, since the width of the phase change region 34 is smaller than the widths of the bottom electrode 31, the middle electrode 33 and the top electrode 35, the width of the phase change region 34 can be very small while the widths of the bottom electrode 31, the middle electrode 33 and the top electrode 35 are sufficiently large to result in sufficiently small resistances. As a consequence, the phase change region 34 is more completely and uniformly in an amorphous state to reduce variation of the phase change memory device 100 and enhance reliability of the phase change memory device 100. In addition, a resistance of the phase change region 34 is increased because of the smaller width thereof, and therefore a reset current for switching the phase change region 34 from a crystalline state to the amorphous state can be decreased to reduce power consumption of the phase change memory device 100. Moreover, the widths of the bottom electrode 31, the selector 32, the middle electrode 33 and the top electrode 35 can be decreased with the decrease of the width of the phase change region 34 only if the resistances of the bottom electrode 31, the middle electrode 33 and the top electrode 35 are sufficiently small, and therefore spacing between any two adjacent memory cells 3 is increased when a pitch of the phase change memory device 100 remains unchanged, or the pitch of the phase change memory device 100 can be decreased to increase density of the phase change memory device 100.

In some embodiments, the widths of the first conductive lines 1, the widths of the second conductive lines 2, and the widths of the bottom electrodes 31, the selectors 32, the middle electrodes 33 and the top electrodes 34 of the memory cells 3 are smaller than about 30 nm, so the phase change memory device 100 can have a small pitch. Other values are also within the scope of the disclosure.

In some embodiments, for each of the memory cells 3, the width of the phase change region 34 is smaller than about 20 nm, so the phase change region 34 is more completely and uniformly in the amorphous state. Other values are also within the scope of the disclosure.

In some embodiments, for each of the memory cells 3, since the second spacer 37 having a thermal conductivity smaller than that of the first spacer 36 is included, the heat generated by the phase change region 34 can be confined, so it is hard for the phase change region 34 to thermally disturb the phase change regions 34 of other memory cells 3, and the reset current can be decreased to reduce the power consumption of the phase change memory device 100. In addition, when the second spacer 37 is formed with the lattice dislocation, the thermal conductivity of the second spacer 37 can be further reduced to better confine the heat generated by the phase change region 34.

In some embodiments, for each of the memory cells 3, a total thickness of the first and second spacers 36, 37 falls within a range from about 5 nm to about 10 nm. Each of the first spacer 36 and the layer(s) of the second spacer 37 has a thickness ranging from about 0.1 nm to about several nm. Other values are also within the scope of the disclosure.

In some embodiments, for each of the memory cells 3, the thermal conductivities of the first and second spacers 36, 37 are smaller than about 20 W/(m·K). Other values are also within the scope of the disclosure.

In some embodiments, the bottom electrode 31 and the selector 32 of each of the memory cells 3 are omitted, and the phase change memory device 100 further includes a plurality of transistors (not shown) that are used to respectively select the memory cells 3.

In some embodiments, for each of the memory cells 3, the width of the phase change region 34 is designed in such a way that a threshold voltage of the phase change region 34 matches a threshold voltage of the selector 32, thereby ensuring proper operation of the phase change memory device 100.

In some embodiments, the phase change memory device 100 includes a number (N+1) of layers of conductive lines and a number (N) of layers of memory cells, where N is an integer greater than one. The $n^{th}$ layer of memory cells is disposed between the $n^{th}$ layer and the $(n+1)^{th}$ layer of the conductive lines, where 1≤n≤N.

Figure 39:
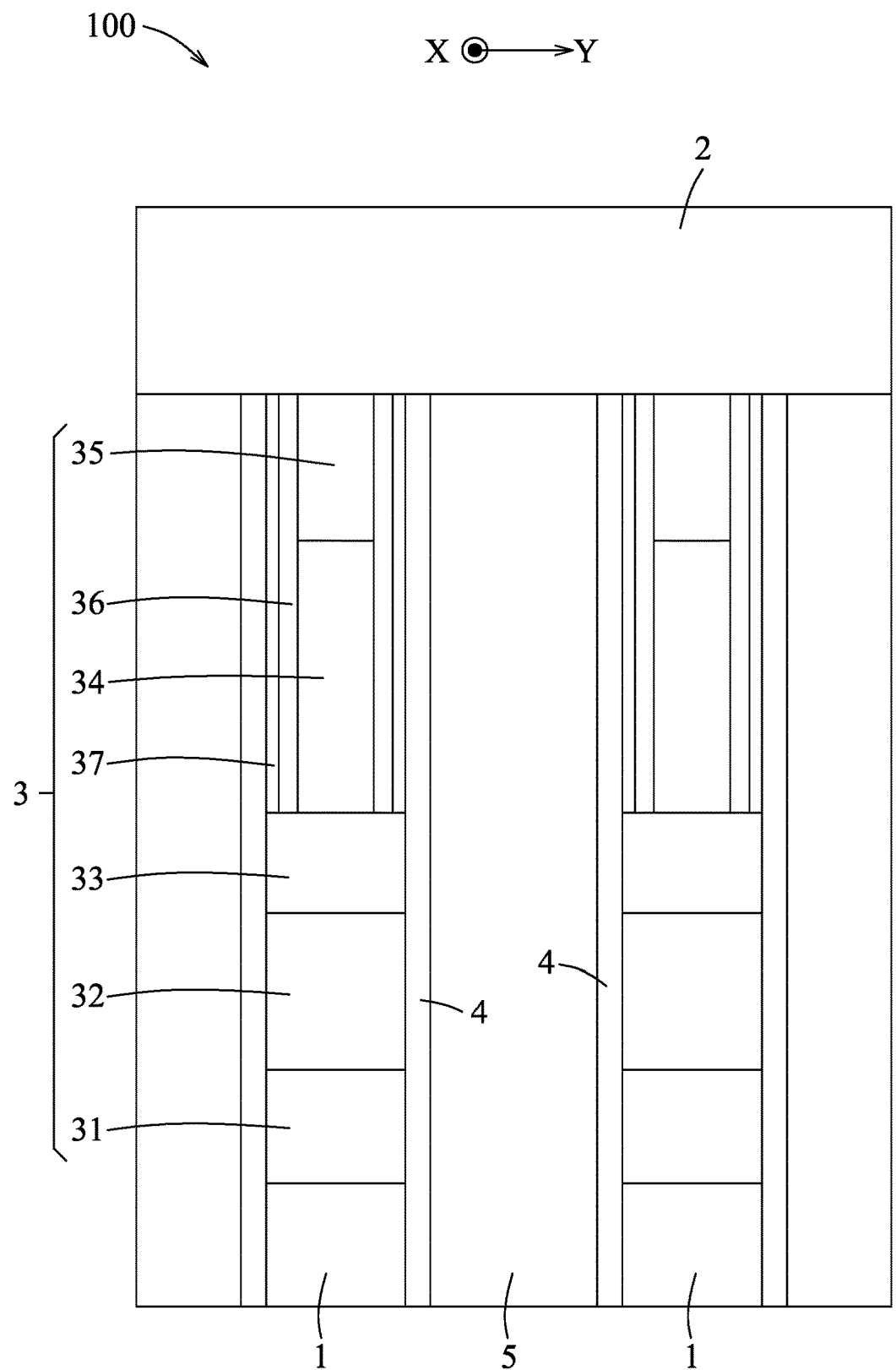
FIGS. 39 and 40 are schematic sectional views of the phase change memory device respectively taken along line A-A' and line B-B' in FIG. 3 in accordance with some embodiments.
Figure 40:
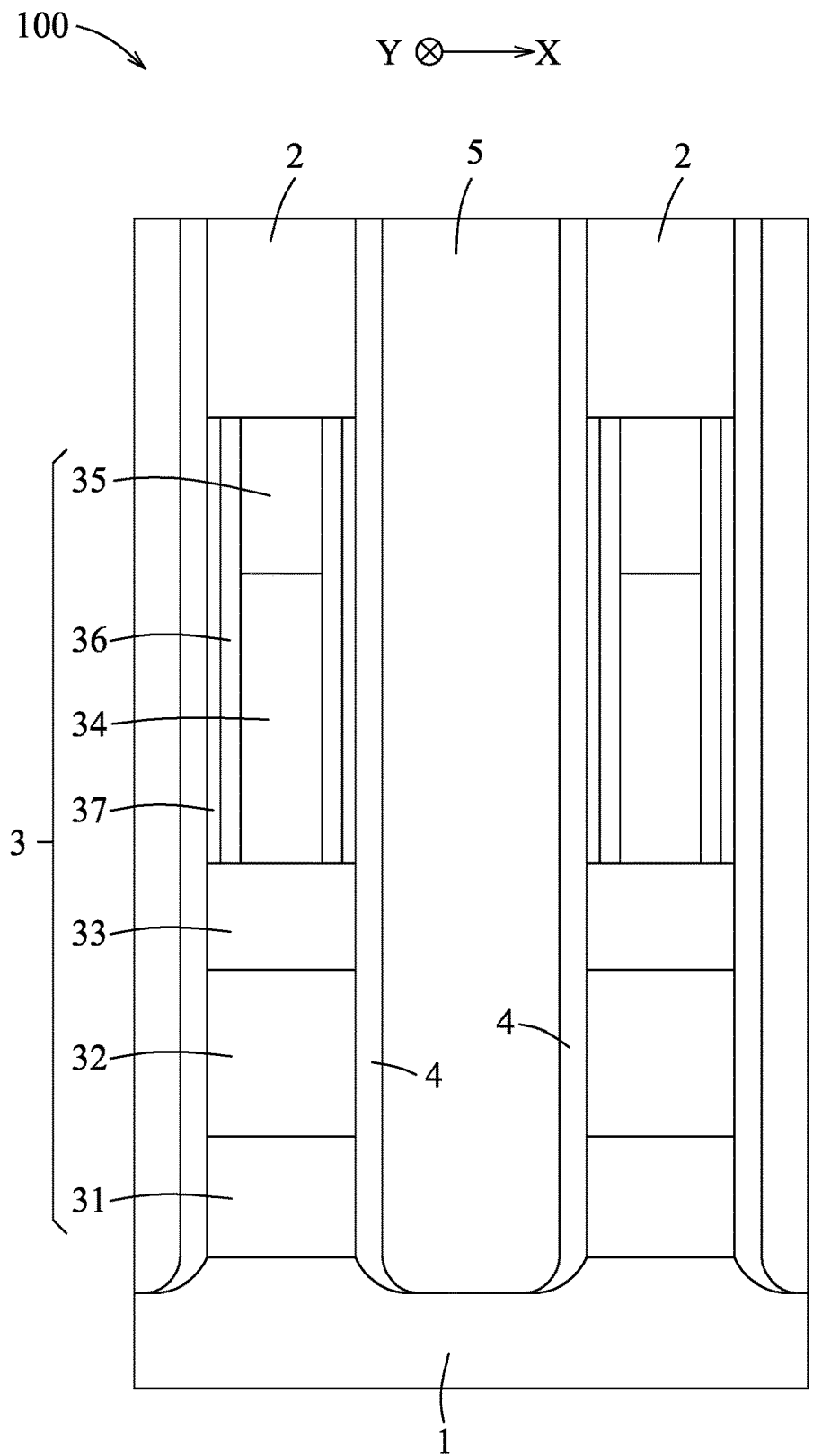

FIGS. 39 and 40 are schematic sectional views of the phase change memory device 100 respectively taken along line A-A' in the Y direction and line B-B' in the X direction of FIG. 3 in accordance with some embodiments. The phase change memory device 100 shown in FIGS. 39 and 40 are similar to the phase change memory device 100 shown in FIGS. 4 and 5, and differs from the phase change memory device 100 shown in FIGS. 4 and 5 in that, for each of the memory cells 3, the width of the top electrode 35 is equal to, instead of greater than, the width of the phase change region 34, and the first spacer 36 laterally covers not only the phase change region 34 but also the top electrode 35. In addition, the phase change memory device 100 shown in FIGS. 39 and 40 may be manufactured by a method which is similar to the method 600 shown in FIGS. 7 and 8, and which differs from the method 600 in that: (a) the block 603 (see FIG. 7) is omitted; (b) in block 605 (see FIG. 7), the second spacer layer and the first spacer layer are anisotropically etched to remove the horizontal portions of the first and second spacer layers; (c) in block 612 (see FIG. 8), the top electrodes are also laterally recessed in the first direction; and (d) in block 614 (see FIG. 8), the another second spacer layer and the another first spacer layer are anisotropically etched to leave the portions of the another first and second spacer layers that laterally cover the top electrodes and the phase change regions along the second direction.

In accordance with some embodiments of the present disclosure, a phase change memory device includes a first electrode, a second electrode, a phase change region, a first spacer and a second spacer. The second electrode is disposed over the first electrode. The phase change region is disposed between the first and second electrodes. The first spacer laterally covers the phase change region. The second spacer laterally covers the first spacer, and has a thermal conductivity smaller than that of the first spacer.

In accordance with some embodiments of the present disclosure, a phase change memory device includes a first electrode, a second electrode, a phase change region and a spacer. The second electrode is disposed over the first electrode. The phase change region is disposed between the first and second electrodes, and has a width smaller than a width of each of the first and second electrodes. The spacer laterally covers the phase change region, and extends between the first and second electrodes.

In accordance with some embodiments of the present disclosure, a method for manufacturing a phase change memory device includes sequentially depositing a first electrode layer, a phase change layer and a second electrode layer; recessing the second electrode layer and the phase change layer to form a second electrode strip that extends in a first direction and a phase change strip that is aligned with the second electrode strip; forming two first spacer strips that laterally cover the phase change strip along the first direction; forming two second spacer strips that respectively cover the first spacer strips along the first direction; recessing the first electrode layer to form a first electrode strip that is aligned with the second electrode strip; recessing the second electrode strip, the phase change strip, the first spacer strips and the second spacer strips to form a second electrode, a phase change region, two first spacer elements and two second spacer elements, the phase change region being aligned with the second electrode, the first spacer elements laterally covering the phase change region along the first direction, the second spacer elements respectively covering the first spacer elements along the first direction; forming two another first spacer elements that laterally cover the phase change region along a second direction; forming two another second spacer elements that respectively cover the another first spacer elements along the second direction; and recessing the first electrode strip to form a first electrode that is aligned with the second electrode.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A phase change memory device comprising:
a first electrode;
a second electrode disposed over the first electrode;
a phase change region disposed between the first and second electrodes, and storing data;
a first spacer laterally covering the phase change region;
a second spacer laterally covering the first spacer, having a thermal conductivity smaller than that of the first spacer, and including a plurality of dielectric layers that are arranged from inside to outside and that have a same height;
a third electrode disposed below the first electrode; and
a selector disposed between the first electrode and the third electrode;
wherein none of the first electrode, the third electrode and the selector is laterally covered by the second spacer, and
wherein the selector is a switching element.

2. The phase change memory device according to claim 1, wherein the dielectric layers include at least one first dielectric layer, and at least one second dielectric layer that is different from the at least one first dielectric layer in terms of lattice arrangement and that is arranged alternatingly with the at least one first dielectric layer.

3. The phase change memory device according to claim 2, wherein the at least one first dielectric layer is made of silicon oxide or silicon oxycarbide, and the at least one second dielectric layer is made of silicon nitride or silicon carbide.

4. The phase change memory device according to claim 1, wherein a combination of the phase change region, the first spacer and the second spacer has a width equal to a width of the first electrode.

5. The phase change memory device according to claim 1, wherein the selector has a uniform width equal to a width of each of the first electrode and the third electrode.

6. The phase change memory device according to claim 1, wherein the phase change region has a width smaller than a width of each of the first and second electrodes.

7. The phase change memory device according to claim 1, wherein the phase change region has a width that is smaller than a width of the first electrode, and that is equal to a width of the second electrode.

8. A phase change memory device comprising:
a first electrode;
a second electrode disposed over the first electrode;
a phase change region disposed between the first and second electrodes, storing data, and having a width smaller than a width of each of the first and second electrodes;
a first spacer laterally covering the phase change region, and extending between the first and second electrodes;
a second spacer laterally covering the first spacer, having a thermal conductivity smaller than that of the first spacer, and including a plurality of dielectric layers that are arranged from inside to outside and that have a same height;
a third electrode disposed below the first electrode; and
a selector disposed between the first electrode and the third electrode;
wherein none of the first electrode, the third electrode and the selector is laterally covered by the second spacer, and
wherein the selector is a switching element.

9. The phase change memory device according to claim 8, wherein the dielectric layers include at least one first dielectric layer, and at least one second dielectric layer that is different from the at least one first dielectric layer in terms of lattice arrangement and that is arranged alternatingly with the at least one first dielectric layer.

10. The phase change memory device according to claim 9, wherein the at least one first dielectric layer is made of silicon oxide or silicon oxycarbide, and the at least one second dielectric layer is made of silicon nitride or silicon carbide.

11. The phase change memory device according to claim 8, wherein each of the dielectric layers extends between the first and second electrodes.

12. The phase change memory device according to claim 11, wherein each of the first spacer and the dielectric layers is in contact with a top surface of the first electrode and a bottom surface of the second electrode.

13. The phase change memory device according to claim 8, wherein a combination of the phase change region, the first spacer and the second spacer has a width equal to the width of the first electrode.

14. The phase change memory device according to claim 8, wherein the selector has a uniform width equal to a width of each of the first electrode and the third electrode.

15. A phase change memory device comprising:
a first electrode;
a second electrode disposed over the first electrode;
a phase change region disposed between the first and second electrodes, storing data, and having a width smaller than a width of the first electrode;
a first spacer laterally covering the phase change region;

a second spacer laterally covering the first spacer, having a thermal conductivity smaller than that of the first spacer, formed with lattice dislocation, and including a plurality of dielectric layers that are arranged from inside to outside and that have a same height;
a third electrode disposed below the first electrode; and
a selector disposed between the first electrode and the third electrode;
wherein none of the first electrode, the third electrode and the selector is laterally covered by the second spacer, and
wherein the selector is a switching element.

16. The phase change memory device according to claim 15, wherein the dielectric layers include at least one first dielectric layer, and at least one second dielectric layer that is different from the at least one first dielectric layer in terms of lattice arrangement and that is arranged alternatingly with the at least one first dielectric layer.

17. The phase change memory device according to claim 16, wherein the at least one first dielectric layer is made of silicon oxide or silicon oxycarbide, and the at least one second dielectric layer is made of silicon nitride or silicon carbide.

18. The phase change memory device according to claim 15, wherein the first spacer extends between the first and second electrodes, and is in contact with a top surface of the first electrode and a bottom surface of the second electrode.

19. The phase change memory device according to claim 15, wherein the first spacer is in contact with a top surface of the first electrode, and further laterally covers the second electrode.

20. The phase change memory device according to claim 15, wherein the selector has a uniform width equal to a width of each of the first electrode and the third electrode.

* * * * *